(12) United States Patent
Godo et al.

(10) Patent No.: US 8,120,030 B2
(45) Date of Patent: Feb. 21, 2012

(54) THIN FILM TRANSISTOR AND DISPLAY DEVICE

(75) Inventors: Hiromichi Godo, Kanagawa (JP); Satoshi Kobayashi, Gifu (JP); Hidekazu Miyairi, Kanagawa (JP); Toshiyuki Isa, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 90 days.

(21) Appl. No.: 12/633,067

(22) Filed: Dec. 8, 2009

(65) Prior Publication Data
US 2010/0148175 A1 Jun. 17, 2010

(30) Foreign Application Priority Data

Dec. 11, 2008 (JP) .................. 2008-316196
May 28, 2009 (JP) .................. 2009-128675

(51) Int. Cl.
*H01L 29/04* (2006.01)
(52) U.S. Cl. ....... 257/57; 257/59; 257/72; 257/E23.273; 257/E29.289; 257/E29.291
(58) Field of Classification Search ............ 257/57, 257/59, 72, E29.273, E29.289, E29.291
See application file for complete search history.

(56) References Cited

U.S. PATENT DOCUMENTS

| | | | |
|---|---|---|---|
| 4,409,134 A | 10/1983 | Yamazaki | |
| 5,453,858 A | 9/1995 | Yamazaki | |
| 5,648,662 A | 7/1997 | Zhang et al. | |
| 5,701,167 A | 12/1997 | Yamazaki | |
| 5,766,989 A | 6/1998 | Maegawa et al. | |
| 5,801,398 A | 9/1998 | Hebiguchi | |
| 5,811,328 A | 9/1998 | Zhang et al. | |
| 5,849,601 A | 12/1998 | Yamazaki | |
| 6,023,075 A | 2/2000 | Yamazaki | |
| 6,091,467 A | 7/2000 | Kubo et al. | |
| 6,124,155 A | 9/2000 | Zhang et al. | |

(Continued)

FOREIGN PATENT DOCUMENTS

EP 0 473 988 A1 3/1992

(Continued)

OTHER PUBLICATIONS

International Search Report (Application No. PCT/JP2009/069752; PCT12066/12399) Dated Feb. 16, 2010.

(Continued)

*Primary Examiner* — Andy Huynh
(74) *Attorney, Agent, or Firm* — Nixon Peabody LLP; Jeffrey L. Costellia

(57) ABSTRACT

Off current of a bottom gate thin film transistor in which a semiconductor layer is shielded from light by a gate electrode is reduced. A thin film transistor includes a gate electrode layer; a first semiconductor layer; a second semiconductor layer, provided on and in contact with the first semiconductor layer; a gate insulating layer between and in contact with the gate electrode layer and the first semiconductor layer; impurity semiconductor layers in contact with the second semiconductor layer; and source and drain electrode layers partially in contact with the impurity semiconductor layers and the first and second semiconductor layers. The entire surface of the first semiconductor layer on the gate electrode layer side is covered by the gate electrode layer; and a potential barrier at a portion where the first semiconductor layer is in contact with the source or drain electrode layer is 0.5 eV or more.

16 Claims, 20 Drawing Sheets

U.S. PATENT DOCUMENTS

| | | | |
|---|---|---|---|
| 6,166,399 | A | 12/2000 | Zhang et al. |
| 6,252,249 | B1 | 6/2001 | Yamazaki |
| 6,306,213 | B1 | 10/2001 | Yamazaki |
| 6,335,213 | B1 | 1/2002 | Zhang et al. |
| 6,756,258 | B2 | 6/2004 | Zhang et al. |
| 6,797,548 | B2 | 9/2004 | Zhang et al. |
| 6,847,064 | B2 | 1/2005 | Zhang et al. |
| 6,885,389 | B2 | 4/2005 | Inoue et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,611,930 | B2 | 11/2009 | Yamazaki |
| 2004/0188685 | A1 | 9/2004 | Lin et al. |
| 2005/0017243 | A1 | 1/2005 | Zhang et al. |
| 2006/0024866 | A1 | 2/2006 | Gan et al. |
| 2006/0027804 | A1 | 2/2006 | Yamazaki et al. |
| 2007/0018165 | A1 | 1/2007 | Yamazaki |
| 2008/0044962 | A1 | 2/2008 | Zhang et al. |
| 2009/0001375 | A1 | 1/2009 | Yamazaki et al. |
| 2009/0002591 | A1 | 1/2009 | Yamazaki et al. |
| 2009/0020759 | A1 | 1/2009 | Yamazaki |
| 2009/0021664 | A1 | 1/2009 | Yamazaki |
| 2009/0139447 | A1* | 6/2009 | Toriumi ............ 117/84 |
| 2009/0140259 | A1 | 6/2009 | Yamazaki et al. |
| 2010/0148178 | A1 | 6/2010 | Godo et al. |

FOREIGN PATENT DOCUMENTS

| | | |
|---|---|---|
| JP | 60-017962 | 1/1985 |
| JP | 60-098680 A | 6/1985 |
| JP | 61-087371 A | 5/1986 |
| JP | 04-242724 A | 8/1992 |
| JP | 05-063196 | 3/1993 |
| JP | 06-045354 A | 2/1994 |
| JP | 07-122754 A | 5/1995 |
| JP | 08-116060 | 5/1996 |
| JP | 08-195492 A | 7/1996 |
| JP | 10-020298 A | 1/1998 |
| JP | 11-121761 A | 4/1999 |
| JP | 2002-246605 A | 8/2002 |
| JP | 2005-049832 A | 2/2005 |
| JP | 2005-167051 A | 6/2005 |
| JP | 2007-005508 A | 1/2007 |
| JP | 2007-035964 A | 2/2007 |
| JP | 2008-218796 | 9/2008 |

OTHER PUBLICATIONS

Written Opinion (Application No. PCT/JJP2009/069752; PCT12066/12399) Dated Feb. 16, 2010.

Esmaeili-Rad.M et al., "High Stability, Low Leakage Nanocrystalline Silicon Bottom Gate Thin Film Transistors for AMOLED Displays,", IEEE IEDM, 2006, pp. 303-306.

Lee.H et al., "Leakage Current Mechanisms in Top-Gate Nanocrystalline Silicon Thin-Film Transistors,", Appl. Phys. Lett. (Applied Physics Letters), Feb. 28, 2008, vol. 92, pp. 083509-1-083509-3.

Lee.C et al., "Stability of nc-Si:H TFTs With Silicon Nitride Gate Dielectric,", IEEE Transactions on Electron Devices, Jan. 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Lee.C et al., "Directly Deposited Nanocrystalline Silicon Thin-Film Transistors With Ultra High Mobilities,", Appl. Phys. Lett. (Applied Physics Letters), Dec. 18, 2006, vol. 89, pp. 252101-1-252101-3.

Lee.C et al., "Top-Gate TFTs Using 13.56MHz PECVD Microcrystalline Silicon,", IEEE Electron Device Letters, Sep. 5, 2005, vol. 26, No. 9, pp. 637-639.

Lee.C et al., "Postdeposition Thermal Annealing and Material Stability of 75° C. Hydrogenated Nanocrystalline Silicon Plasma-Enhanced Chemical Vapor Deposition Films,", J. Appl. Phys. (Journal of Applied Physics), Aug. 4, 2005, vol. 98, pp. 034305-1-034305-7.

Lee.C et al., "High-Mobility Nanocrystalline Silicon Thin-Film Transistors Fabricated by Plasma-Enhanced Chemical Vapor Deposition,", Appl. Phys. Lett. (Applied Physics Letters), May 24, 2005, vol. 86, pp. 222106-1-222106-3.

Lee.C et al., "High-Mobility N-Channel and P-Channel Nanocrystalline Silicon Thin-Film Transistors,", IEDM 05: Technical Digest of International Electron Devices Meeting, 2005, pp. 937-940.

Lee.C et al., "How to Achieve High Mobility Thin Film Transistors by Direct Deposition of Silicon Using 13.56 MHz RF PECVD?,", IEDM, 2006, pp. 295-298.

Arai.T et al., "41.2: Micro Silicon Technology for Active Matrix OLED Display,", SID Digest '07 : SID International Symposium Digest of Technical Papers, 2007, vol. XXXVIII, pp. 1370-1373.

Esmaeili-Rad.M et al., "Absence of Defect State Creation in Nanocrystalline Silicon Thin-Film Transistors Deduced From Constant Current Stress Measurements,", Appl. Phys. Lett. (Applied Physics Letters), Sep. 12, 2007, vol. 91, pp. 113511-1-113511-3.

Esmaeili-Rad.M et al., "Stability of Nanocrystalline Silicon Bottom-Gate Thin-Film Transistors With Silicon Nitride Gate Dielectric,", J. Appl. Phys. (Journal of Applied Physics), Sep. 28, 2007, vol. 102, pp. 064512-1-064512-7.

* cited by examiner

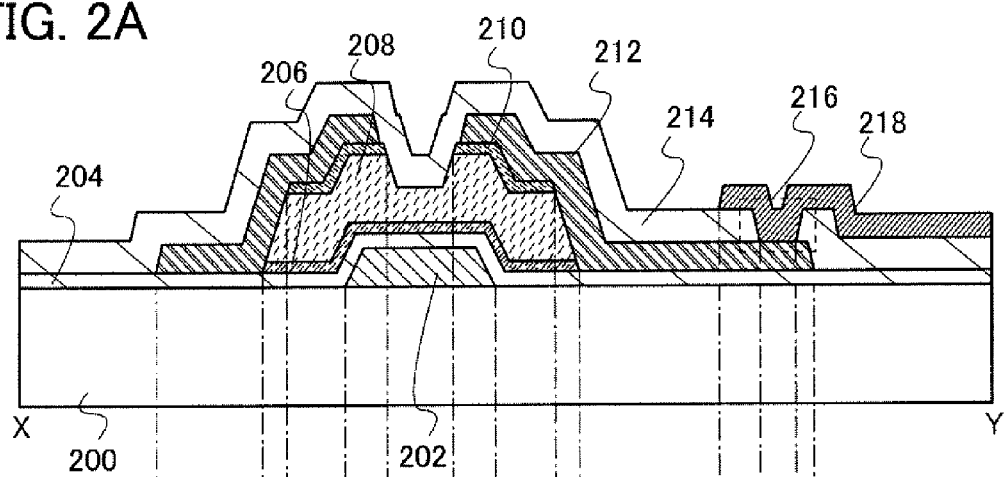
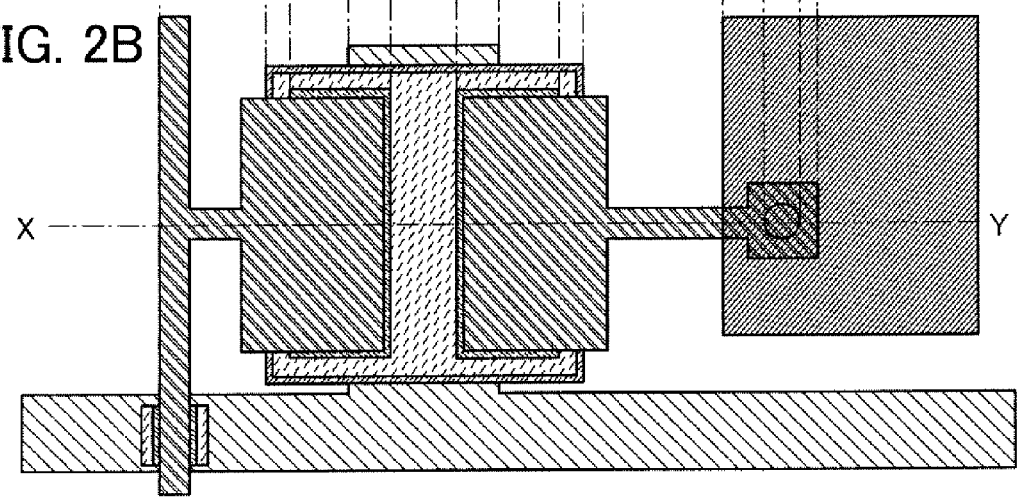

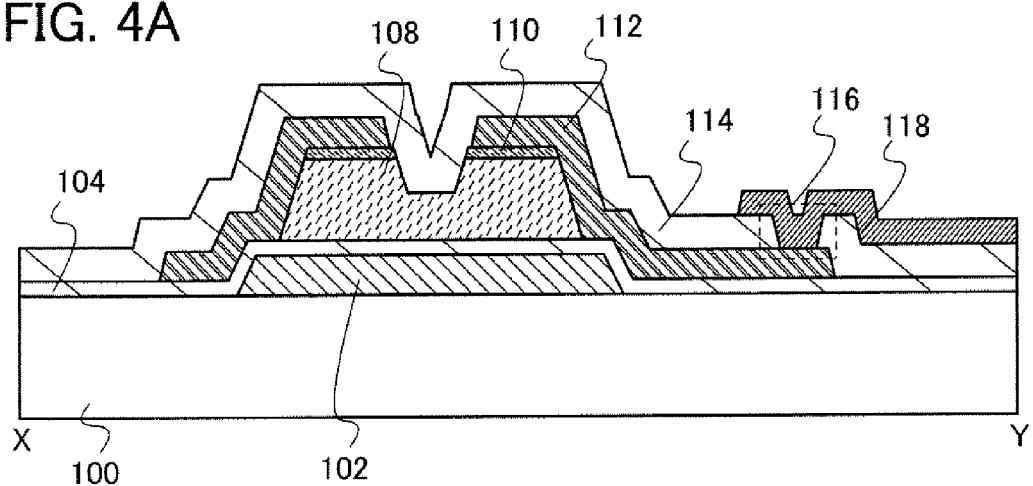
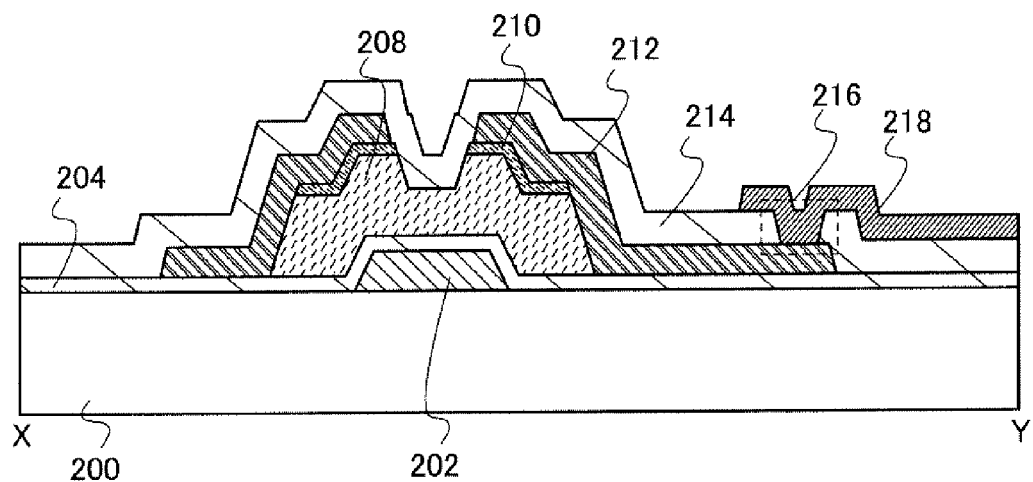

$\phi = 3.9 eV$ $\phi = 4.2 eV$ (A) $\phi = 4.5\text{eV}$

THIN FILM TRANSISTOR AND DISPLAY DEVICE

TECHNICAL FIELD

The present invention relates to a thin film transistor and a display device.

BACKGROUND ART

In recent years, a thin film transistor including a thin semiconductor film (with a thickness of several nanometers to several hundreds nanometers, approximately) over a substrate having an insulating surface (e.g., a glass substrate) has been attracting attention. Thin film transistors are widely used for ICs (integrated circuits) and electronic devices such as electro-optical devices. In particular, thin film transistors are rapidly developed as switching elements of image display devices typified by liquid crystal display devices and the like. In image display devices such as liquid crystal display devices, a thin film transistor using an amorphous semiconductor film or a thin film transistor using a polycrystalline semiconductor film is mainly used as a switching element. Further, a thin film transistor using a microcrystalline semiconductor film is known (Patent Document 1, for example).

The performance of a thin film transistor is more excellent as the amount of change in current which flows between a source and a drain is larger when gate voltage is changed. A subthreshold swing is widely known, which shows the amount of change in current which flows between a source and a drain when gate voltage is changed.

In addition, in a thin film transistor, the amount of light leakage current needs to be reduced. The light leakage current is a current which is generated when the photovoltaic effect is caused in a semiconductor layer of the thin film transistor by irradiation of the semiconductor layer with light and flows between a source and a drain. Therefore, a lot of researches have been conducted on a technique for shielding the semiconductor layer of the thin film transistor from light (Patent Documents 2 and 3, for example).

REFERENCE

Patent Document

[Patent Document 1] U.S. Pat. No. 4,409,134
[Patent Document 2] Japanese Published Patent Application No. H10-20298
[Patent Document 3] Japanese Published Patent Application No. H7-122754

DISCLOSURE OF INVENTION

For example, in a thin film transistor which is applied to a display device, light leakage current is generated by irradiation of a semiconductor layer with light. When the light leakage current is generated, for example, a contrast ratio of the display device is lowered, which deteriorates the display quality. The semiconductor layer is preferably shielded from light in order to suppress such light leakage current. For instance, a gate electrode may be provided so as to overlap with the semiconductor layer, on the side from which light enters.

However, for example, off current tends to be increased in a thin film transistor in which an amorphous semiconductor layer is stacked over a microcrystalline semiconductor layer and a gate electrode overlaps with these semiconductor layers. In particular, in the case where $V_{gs}<0$, as the gate voltage is lowered, off current is greatly increased, that is, off current jumps significantly.

In view of the above problems, it is an object to provide a thin film transistor whose off current does not jump significantly even when a semiconductor layer is shielded from light by a gate electrode.

One embodiment of the present invention is a bottom gate thin film transistor which includes a semiconductor layer in which a semiconductor layer with low carrier mobility is stacked over a semiconductor layer with high carrier mobility. The entire surface of the semiconductor layer is shielded from light by a gate electrode, and a potential barrier at a portion where the semiconductor layer with high carrier mobility and a drain electrode are in contact with each other is large. Specifically, the drain electrode at the above portion is formed using a material with a low work function.

One embodiment of the present invention is a thin film transistor including: a gate electrode layer; a first semiconductor layer; a second semiconductor layer with lower carrier mobility than the first semiconductor layer, provided on and in contact with the first semiconductor layer; a gate insulating layer provided between and in contact with the gate electrode layer and the first semiconductor layer; impurity semiconductor layers provided in contact with the second semiconductor layer; and a source electrode layer and a drain electrode layer provided partially in contact with the impurity semiconductor layers and the first and second semiconductor layers, wherein the entire surface of the first semiconductor layer on the gate electrode layer side overlaps with the gate electrode layer; and wherein a potential barrier at a portion where the first semiconductor layer is in contact with the source or drain electrode layer is greater than or equal to 0.5 eV.

Another embodiment of the present invention is a thin film transistor including: a gate electrode layer; a first semiconductor layer; a second semiconductor layer with lower carrier mobility than the first semiconductor layer, provided on and in contact with the first semiconductor layer; a gate insulating layer provided between and in contact with the gate electrode layer and the first semiconductor layer; impurity semiconductor layers provided in contact with the second semiconductor layer; and a source electrode layer and a drain electrode layer provided partially in contact with the impurity semiconductor layers and the first and second semiconductor layers, wherein the entire surface of the first semiconductor layer on the gate electrode layer side overlaps with the gate electrode layer; and wherein a work function of a material for forming the source and drain electrode layers is $\phi$, an electron affinity of the first semiconductor layer (a difference between a vacuum level and a bottom of a mobility edge of the first semiconductor layer) is $\chi$, a width of a forbidden band of the first semiconductor layer is $E_g$, and $E_g+\chi-\phi$ is greater than or equal to 0.5 eV.

In the thin film transistor with the above structure, the first semiconductor layer is preferably shielded from light by the gate electrode layer. Therefore, the gate electrode layer is preferably formed using a light-blocking material.

In the thin film transistor with the above structure, a width of a forbidden band of the second semiconductor layer is preferably larger than that of the first semiconductor layer with which the source and drain electrode layers are in contact. This is because it is only necessary that at least the potential barrier of the first semiconductor layer be taken into account when the width of the forbidden band of the second semiconductor layer is made larger than that of the first semiconductor layer.

In the thin film transistor with the above structure, the first semiconductor layer includes a crystalline semiconductor and the second semiconductor layer includes an amorphous semiconductor.

In the bottom gate thin film transistor, by providing the second semiconductor layer over the first semiconductor layer, current flows mainly through the first semiconductor layer when the transistor is turned on, and current flows mainly through the second semiconductor layer when the transistor is turned off. Therefore, the first semiconductor layer is formed using a semiconductor with high carrier mobility and the second semiconductor layer is formed using a semiconductor with low carrier mobility, whereby a thin film transistor with large on current and small off current (i.e., a high on/off ratio) can be obtained. In addition, the gate electrode layer overlaps with the semiconductor layers, so that the semiconductor layers can be shielded from light, and the light leakage current can be reduced. That is, with the structure of the thin film transistor which is one embodiment of the present invention, a thin film transistor with small light leakage current and a high on/off ratio can be obtained.

By applying a thin film transistor with small light leakage current and a high on/off ratio to a display device, the display device can have a high contrast ratio and low power consumption.

BRIEF DESCRIPTION OF DRAWINGS

FIGS. 2A and 2B illustrate an example of a structure of a thin film transistor.

FIGS. 4A and 4B each illustrate an example of a structure of a thin film transistor.

BEST MODE FOR CARRYING OUT THE INVENTION

Figure 1A:
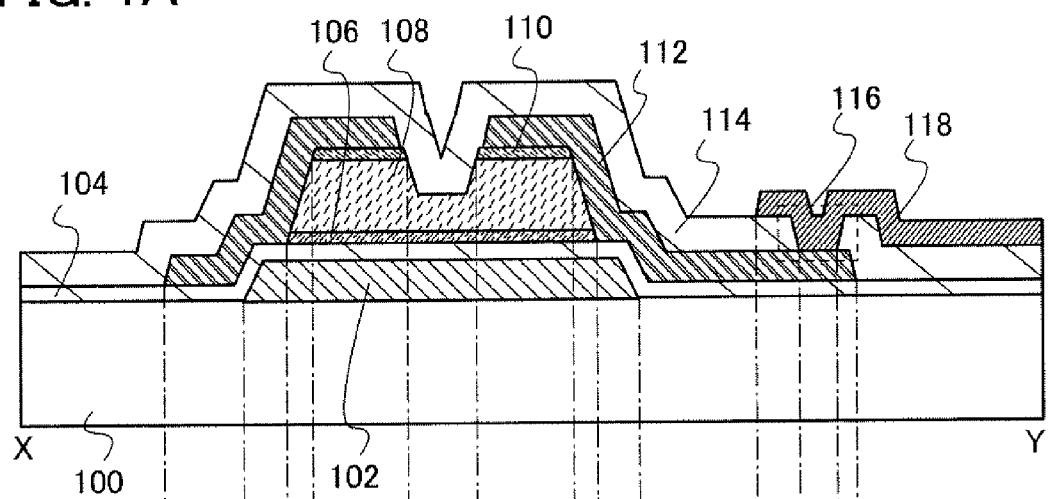
FIGS. 1A and 1B illustrate an example of a structure of a thin film transistor.

Embodiments of the present invention will be hereinafter described in detail with reference to the accompanying drawings. However, the present invention is not limited to the description below, and it is easily understood by those skilled in the art that modes and details thereof can be modified in various ways without departing from the spirit and the scope of the present invention. Therefore, the present invention should not be interpreted as being limited to the description of the embodiments below. Note that reference numerals indicating the same portions are used in common throughout the drawings for describing structures of the present invention with reference to the drawings. Further, in some cases, the same hatching patterns are applied to similar parts, and the similar parts are not especially designated by reference numerals. In addition, an insulating layer is not illustrated in a top view in some cases.

Embodiment 1

In this embodiment, a thin film transistor according to one embodiment of the present invention will be described with reference to the drawings.

Figure 1B:
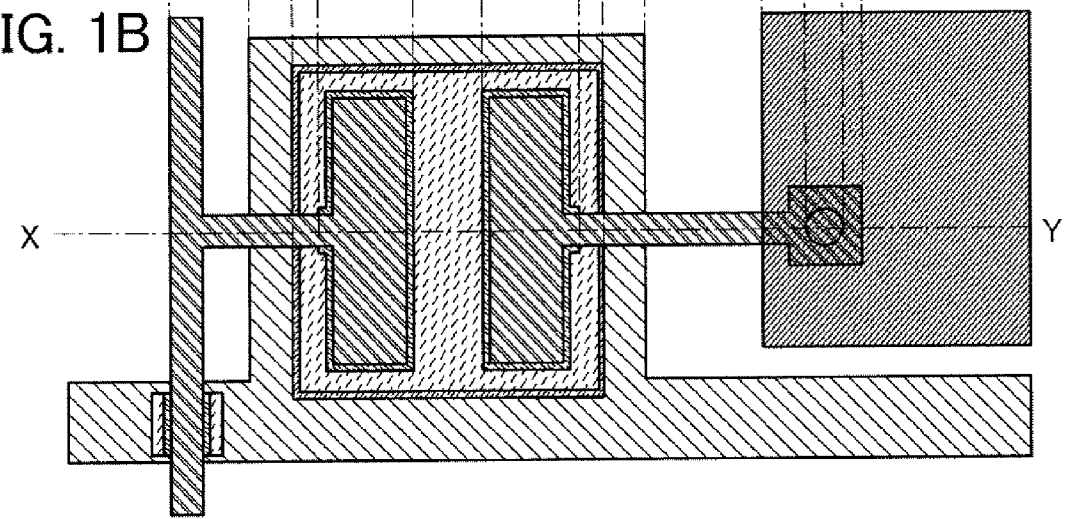

FIGS. 1A and 1B illustrate an example of a thin film transistor of this embodiment.

A thin film transistor illustrated in FIGS. 1A and 1B includes a gate electrode layer 102, a semiconductor layer (a first semiconductor layer 106 and a second semiconductor layer 108), a gate insulating layer 104 provided between and in contact with the gate electrode layer 102 and the semiconductor layer, impurity semiconductor layers 110 provided in contact with the semiconductor layer, and source and drain electrode layers 112 provided partially in contact with the impurity semiconductor layers 110 and the semiconductor layer. The entire surface of the semiconductor layer overlaps with the gate electrode layer 102. Further, the thin film transistor is preferably covered by a protective layer 114. In the case of using the thin film transistor as a pixel transistor of a display device, as illustrated in FIGS. 1A and 1B, an opening 116 may be provided in the protective layer 114 and a pixel electrode layer 118 may be provided so as to be connected to the source or drain electrode layer 112 through the opening 116. Note that the second semiconductor layer 108 is provided so as to be in contact with the first semiconductor layer 106 and is preferably formed using a material with lower carrier mobility than the first semiconductor layer 106.

As illustrated in FIGS. 1A and 1B, the entire surface of the semiconductor layer of the thin film transistor overlaps with the gate electrode layer 102, whereby light leakage current from a substrate 100 side can be reduced.

Further, in the thin film transistor illustrated in FIGS. 1A and 1B, the semiconductor layer is formed in such a manner that the first semiconductor layer 106 and the second semiconductor layer 108 are stacked. The second semiconductor layer 108 is provided in order to reduce off current. The second semiconductor layer 108 is provided so as to be in contact with the first semiconductor layer 106 and is preferably formed using a material with lower carrier mobility than the first semiconductor layer 106. For example, a crystalline semiconductor layer may be formed as the first semiconductor layer 106 and "a layer containing an amorphous semiconductor" (a semiconductor layer capable of relieving an electric field), which will be described later, may be formed as the second semiconductor layer 108. When the thin film transistor is turned on, current flows mainly through the first semiconductor layer 106. When the thin film transistor is turned off, current flows mainly through the second semiconductor layer 108. Further, by forming the second semiconductor layer 108 with "a layer containing an amorphous semiconductor" which will be described later, reduction in on current due to the provision of the second semiconductor layer 108 can be prevented. Accordingly, when a crystalline semiconductor layer is formed as the first semiconductor layer 106 and "a layer containing an amorphous semiconductor" which will be described later is formed as the second semiconductor layer 108, a thin film transistor with a high on/off ratio can be obtained. Note that the second semiconductor layer 108 is not limited to "a layer containing an amorphous semiconductor" and may be formed using an amorphous semiconductor, for example.

Now, each of the layers included in the thin film transistor will be described.

The substrate 100 is not limited to a substrate fowled using a particular material as long as it has heat resistance, chemical resistance, and the like enough to withstand a step of forming a thin film (crystalline silicon or the like) which is to be formed over the substrate 100. Specifically, a glass substrate, a quartz substrate, a stainless steel substrate, and a silicon substrate can be used, for example. Note that in the case of applying the thin film transistor illustrated in FIGS. 1A and 1B to a display device, as the substrate 100, a light-transmitting substrate such as a glass substrate or a quartz substrate may be used. When the substrate 100 is a mother glass, the substrate may have any size of from the first generation (e.g., 320 mm×400 mm) to the tenth generation (e.g., 2950 mm×3400 mm); however, the substrate is not limited thereto.

The gate electrode layer 102 can be formed using a metal material such as molybdenum, titanium, chromium, tantalum, tungsten, aluminum, copper, neodymium, or scandium, or an alloy material which contains any of these materials as a main component. The gate electrode layer 102 may be a single layer or a stacked layer of these materials. Note that the gate electrode layer 102 also forms a gate wiring.

The gate insulating layer 104 can be formed using silicon oxide, silicon nitride, silicon oxynitride, or silicon nitride oxide. The gate insulating layer 104 may be a single-layer or a stacked layer of the above-described materials. When the first semiconductor layer 106 is a crystalline semiconductor layer, at least the gate insulating layer 104 which is in contact with the first semiconductor layer 106 is formed using a silicon oxide layer, whereby the crystallinity of the first semiconductor layer 106 can be improved. The silicon oxide layer is preferably formed using tetraethoxysilane (TEOS; $Si(OC_2H_5)_4$) as a source gas.

As described above, the first semiconductor layer 106 is preferably formed using a crystalline semiconductor. The crystalline semiconductor includes a polycrystalline semiconductor, a microcrystalline semiconductor, and the like. The first semiconductor layer 106 is preferably formed using a microcrystalline semiconductor which does not need a crystallization step.

The second semiconductor layer 108 preferably has an amorphous semiconductor and a minute semiconductor crystal grain and has lower energy at an urbach edge measured by a constant photocurrent method (CPM) or photoluminescence spectroscopy and a smaller amount of absorption spectra of defects, compared to a conventional amorphous semiconductor. That is, compared to the conventional amorphous semiconductor, such a semiconductor layer is a well-ordered semiconductor layer which has fewer defects and whose tail slope of a level at a band edge (a mobility edge) in the valence band is steep. Such a semiconductor layer is referred to as "a layer containing an amorphous semiconductor" in this specification.

Note that the second semiconductor layer 108 is not limited to the above description and may be formed using an amorphous semiconductor. The second semiconductor layer 108 may be formed using a material at least with lower carrier mobility than that of the first semiconductor layer 106.

A preferable mode of each of the first semiconductor layer 106 and the second semiconductor layer 108 will be described.

The first semiconductor layer 106 is preferably formed using a microcrystalline semiconductor, for example. Here, a microcrystalline semiconductor is a semiconductor having an intermediate structure between amorphous and crystalline structures (including a single crystal structure and a polycrystalline structure). A microcrystalline semiconductor is a semiconductor having a third state that is stable in terms of free energy and a crystalline semiconductor having short-range order and lattice distortion, in which columnar or needle-like crystals having a grain size of 2 nm to 200 nm inclusive, preferably 10 nm to 80 nm inclusive, more preferably 20 nm to 50 nm inclusive have grown in a normal direction with respect to the substrate surface. Therefore, a crystal grain boundary is formed at the interface of the columnar or needle-like crystals in some cases.

Microcrystalline silicon, which is one of microcrystalline semiconductors, has a peak of Raman spectrum which is shifted to a lower wave number side than 520 $cm^{-1}$ that represents single crystal silicon. In other words, the peak of the Raman spectrum of the microcrystalline silicon is between 520 $cm^{-1}$ which represents single crystal silicon and 480 $cm^{-1}$ which represents amorphous silicon. Further, microcrystalline silicon includes hydrogen or halogen of at least 1 at. % for termination of dangling bonds. Moreover, microcrystalline silicon contains a rare gas element such as helium, argon, krypton, or neon to further promote lattice distortion, so that stability is increased and a favorable microcrystalline semiconductor can be obtained. Such a microcrystalline semiconductor is disclosed in, for example, Patent Document 1 (U.S. Pat. No. 4,409,134).

Further, when the concentration of oxygen and nitrogen contained in the first semiconductor layer 106 (a value measured by secondary ion mass spectrometry) is less than $1\times10^{18}$ atoms/$cm^3$, the crystallinity of the first semiconductor layer 106 can be improved.

The second semiconductor layer 108 is preferably formed using "a layer containing an amorphous semiconductor", "a layer containing an amorphous semiconductor" which contains halogen, "a layer containing an amorphous semiconductor" which contains nitrogen, and most preferably "a layer containing an amorphous semiconductor" which contains an NH group. However, the second semiconductor layer 108 is not limited thereto.

An interface region between the first semiconductor layer 106 and the second semiconductor layer 108 has microcrystalline semiconductor regions and an amorphous semiconductor provided between the microcrystalline semiconductor regions. Specifically, the interface region between the first semiconductor layer 106 and the second semiconductor layer 108 includes a microcrystalline semiconductor region which extends in a convex shape from the first semiconductor layer 106 and "a layer containing an amorphous semiconductor" which is similar to the second semiconductor layer 108.

When the second semiconductor layer 108 is formed using "a layer containing an amorphous semiconductor", "a layer containing an amorphous semiconductor" which contains halogen, "a layer containing an amorphous semiconductor" which contains nitrogen, or "a layer containing an amorphous semiconductor" which contains an NH group, for example, off current of the thin film transistor can be reduced. Further, since the interface region has a conical or pyramidal microcrystalline semiconductor region, resistance of the vertical direction (the film thickness direction), that is, resistance between the second semiconductor layer 108 and a source region or a drain region formed with the impurity semiconductor layer 110, can be lowered, so that on current of the thin film transistor can be increased.

Alternatively, a structure without the second semiconductor layer 108 may be employed. In this case, the above interface region may be provided between the first semiconductor layer 106 and the impurity semiconductor layer 110. The interface region has microcrystalline semiconductor regions and an amorphous semiconductor region provided between the microcrystalline semiconductor regions. The microcrystalline semiconductor region is formed with a microcrystalline semiconductor which extends from the first semiconductor layer 106. At this time, it is preferable that the proportion of the microcrystalline semiconductor region with respect to the amorphous semiconductor region in the interface region be small. It is further preferable that the proportion of the microcrystalline semiconductor region be small in a region between a pair of the impurity semiconductor layers 110 (between the source region and the drain region), that is, a region where carriers flow. This is because off current of the thin film transistor can be reduced. Further, since resistance of the vertical direction (the film thickness direction) is low in the above interface region, on current of the thin film transistor can be high.

Note that when the first semiconductor layer 106 is thin, on current is reduced, and when the first semiconductor layer 106 is thick, a contact area of the first semiconductor layer 106 and the source and drain electrode layers 112 is increased and as will be described later, off current is increased when the source and drain electrode layers 112 have a high work function.

Most of the above microcrystalline semiconductor region preferably includes a crystal grain having a convex shape whose top gets narrower from the gate insulating layer 104 toward the second semiconductor layer 108. Alternatively, the most of the above microcrystalline semiconductor region may include a crystal grain having a convex shape whose top gets wider from the gate insulating layer 104 toward the second semiconductor layer 108.

When the microcrystalline semiconductor region includes a crystal grain having a convex shape whose top gets narrower from the gate insulating layer 104 toward the second semiconductor layer 108 in the above interface region, the proportion of the microcrystalline semiconductor region at the first semiconductor layer 106 side is higher than that at the second semiconductor layer 108 side. The microcrystalline semiconductor region grows from a surface of the first semiconductor layer 106 in the film thickness direction. When the flow ratio of hydrogen to silane in a source gas is reduced (that is, the dilution ratio is reduced) or the concentration of the source gas containing nitrogen is increased, crystal growth of the microcrystalline semiconductor region is suppressed, and thus, a crystal grain comes to have a conical or pyramidal shape, and a large part of a semiconductor which is formed by deposition becomes amorphous.

Further, the interface region described above preferably includes nitrogen, in particular, an NH group. This is because defects are reduced and carriers flow easily when nitrogen, in particular, an NH group is bonded with dangling bonds of a silicon atom at an interface between crystals included in the microcrystalline semiconductor region or at an interface between the microcrystalline semiconductor region and the amorphous semiconductor region. Accordingly, by setting the concentration of nitrogen, preferably, an NH group, at $1\times10^{20}$ cm$^{-3}$ to $1\times10^{21}$ cm$^{-3}$, the dangling bonds of the silicon atom can be easily cross-linked with nitrogen, preferably an NH group, so that carriers can flow easily. As a result, a bonding which promotes the carrier transfer is formed in a crystal grain boundary or a defect, whereby the carrier mobility of the interface region is increased. Therefore, the field effect mobility of the thin film transistor is improved.

Furthermore, by reducing the concentration of oxygen in the interface region, defects and bonding inhibiting carrier transfer at the interface between the microcrystalline semiconductor region and the amorphous semiconductor region or the interface between the crystal grains can be reduced.

When the distance from the interface of the gate insulating layer 104 to the top of the convex portion of the second semiconductor layer 108 is set at 3 nm to 80 nm inclusive, preferably 5 nm to 30 nm inclusive, off current of the thin film transistor can be effectively reduced.

The impurity semiconductor layers 110 are provided in order that the semiconductor layer and the source and drain electrode layers 112 have ohmic contact with each other and can be formed by using a source gas containing an impurity element imparting one conductivity type. In the case of forming an n-channel thin film transistor, typically, phosphorus may be added as the impurity element; for example, a gas containing an impurity element imparting n-type conductivity, such as phosphine ($PH_3$) may be added into silicon hydride. In the case of forming a p-channel thin film transistor, typically, boron may be added as the impurity element; for example, a gas containing an impurity element imparting p-type conductivity, such as diborane ($B_2H_6$), may be added into silicon hydride. There is no particular limitation on the crystallinity of the impurity semiconductor layers 110. The impurity semiconductor layers 110 may be formed using either a crystalline semiconductor or an amorphous semiconductor, but preferably formed using a crystalline semiconductor. This is because on current is increased when the impurity semiconductor layers 110 are formed using a crystalline semiconductor.

The source and drain electrode layers 112 may be formed with a single layer or a plurality of layers stacked using a conductive material but needs to be formed with a material with a low work function at least at a portion in contact with the first semiconductor layer 106 as will be described later.

The protective layer 114 can be formed in a manner similar to that of the gate insulating layer 104 and is preferably formed using silicon nitride. In particular, a dense silicon nitride layer is preferably used as the protective layer 114 such that entry of a contaminant impurity element such as an organic substance, a metal, or moisture contained in the atmosphere can be prevented. A dense silicon nitride layer can be formed by a plasma CVD method using plasma with a frequency of greater than or equal to 1 GHz, for example.

The pixel electrode layer 118 can be formed using a conductive composition containing a conductive high molecule (also referred to as a conductive polymer) having a light-transmitting property. As a conductive high molecule, a so-called π electron conjugated conductive high molecule can be used. For example, polyaniline or a derivative thereof, polypyrrole or a derivative thereof, polythiophene or a derivative thereof, and a copolymer of two or more kinds of those materials can be given.

Alternatively, the pixel electrode layer 118 may be formed using, for example, indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, indium tin oxide to which silicon oxide is added, or the like.

For comparison, a thin film transistor in which only a part of a semiconductor layer is shielded from light by a gate electrode will be described with reference to FIGS. 2A and 2B.

A thin film transistor illustrated in FIGS. 2A and 2B includes: a gate electrode layer 202; a semiconductor layer (a first semiconductor layer 206 and a second semiconductor layer 208); a gate insulating layer 204 provided between and in contact with the gate electrode layer 202 and the semiconductor layer; impurity semiconductor layers 210 provided in contact with the semiconductor layer; and source and drain electrode layers 212 provided partially in contact with the impurity semiconductor layers 210 and the semiconductor layer. The gate electrode layer overlaps with only a part of the semiconductor layer. Further, in a manner similar to that of the thin film transistor illustrated in FIGS. 1A and 1B, the thin film transistor illustrated in FIGS. 2A and 2B is covered by a protective layer 214 and a pixel electrode layer 218 is provided so as to be connected to the source or drain electrode layer 212 through an opening 216 formed in the protective layer 214. The second semiconductor layer 208 is provided so as to be in contact with the first semiconductor layer 206 and is preferably formed using a material with lower carrier mobility than the first semiconductor layer 206.

When only a part of the semiconductor layer in the thin film transistor overlaps with the gate electrode layer 202 as illustrated in FIGS. 2A and 2B, a part of the semiconductor layer which does not overlap with the gate electrode layer 202 is exposed to light (light which mainly enters from a substrate 200 side), and thus light leakage current cannot be reduced.

Figure 3A:
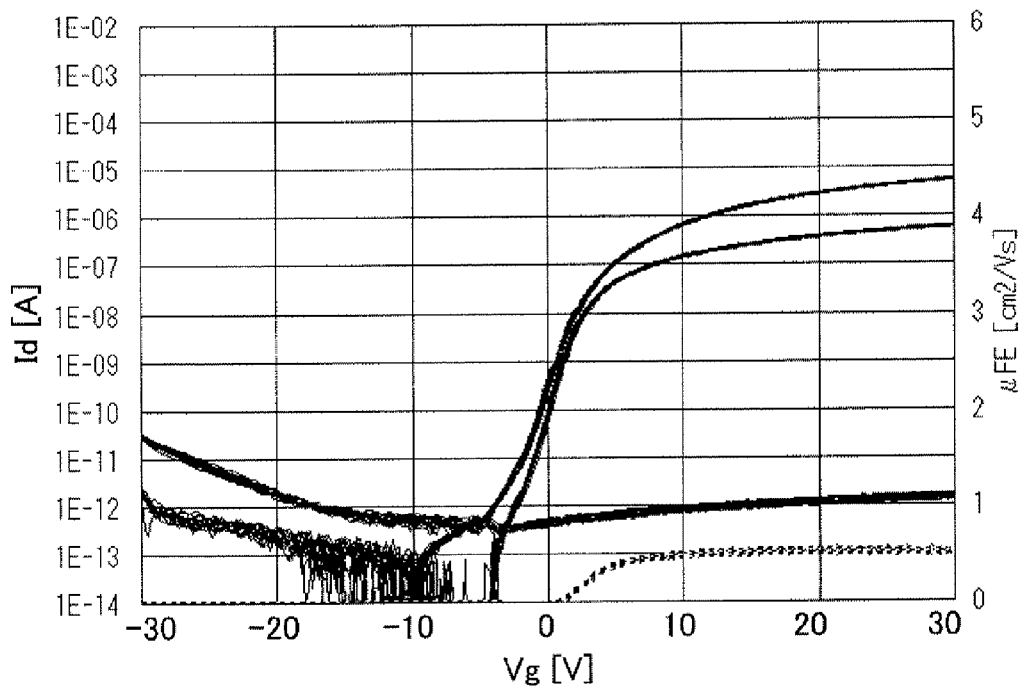
FIGS. 3A and 3B show electric characteristics of thin film transistors.
Figure 3B:
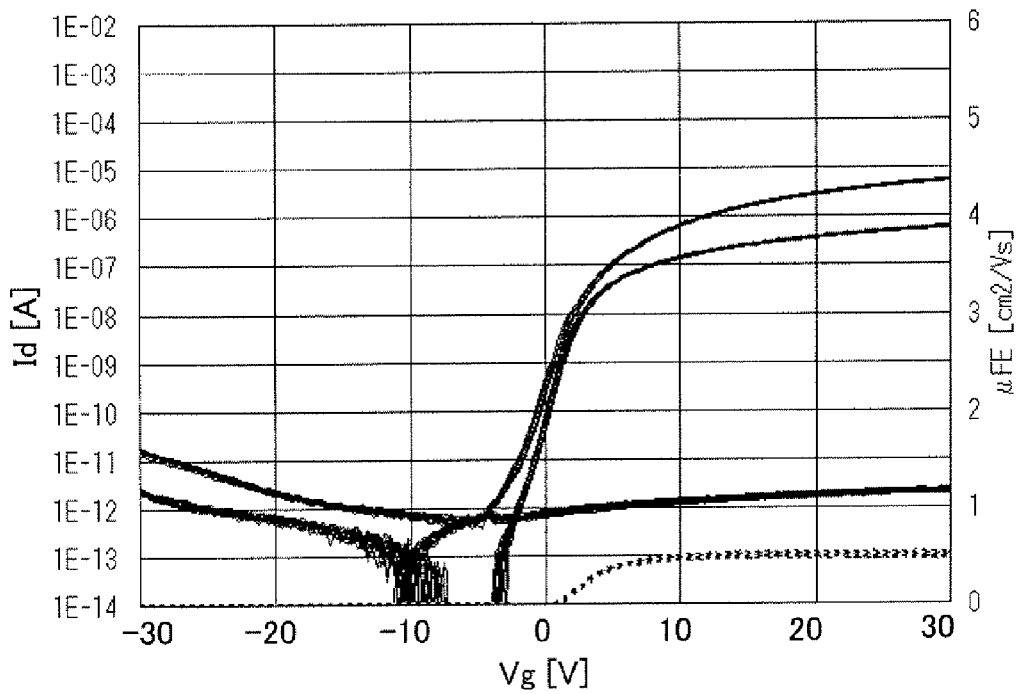

FIGS. 3A and 3B show curves representing current-voltage characteristics of drain current with respect to gate voltage (hereinafter I-V curve) of thin film transistors illustrated in FIGS. 4A and 4B. FIG. 3A shows an I-V curve of the thin film transistor illustrated in FIG. 4A, and FIG. 3B shows an I-V curve of the thin film transistor illustrated in FIG. 4B. As seen in FIGS. 3A and 3B, there is no large difference in off current, which means that there is no large difference in off current between the thin film transistor illustrated in FIG. 4A and the thin film transistor illustrated in FIG. 4B. The thin film transistor illustrated in FIGS. 1A and 1B and the thin film transistor illustrated in FIG. 4A are different in whether or not the first semiconductor layer which is preferably formed with a crystalline semiconductor in contact with the source and drain electrode layers is formed. This difference probably leads to a difference in off current.

Figure 5A:
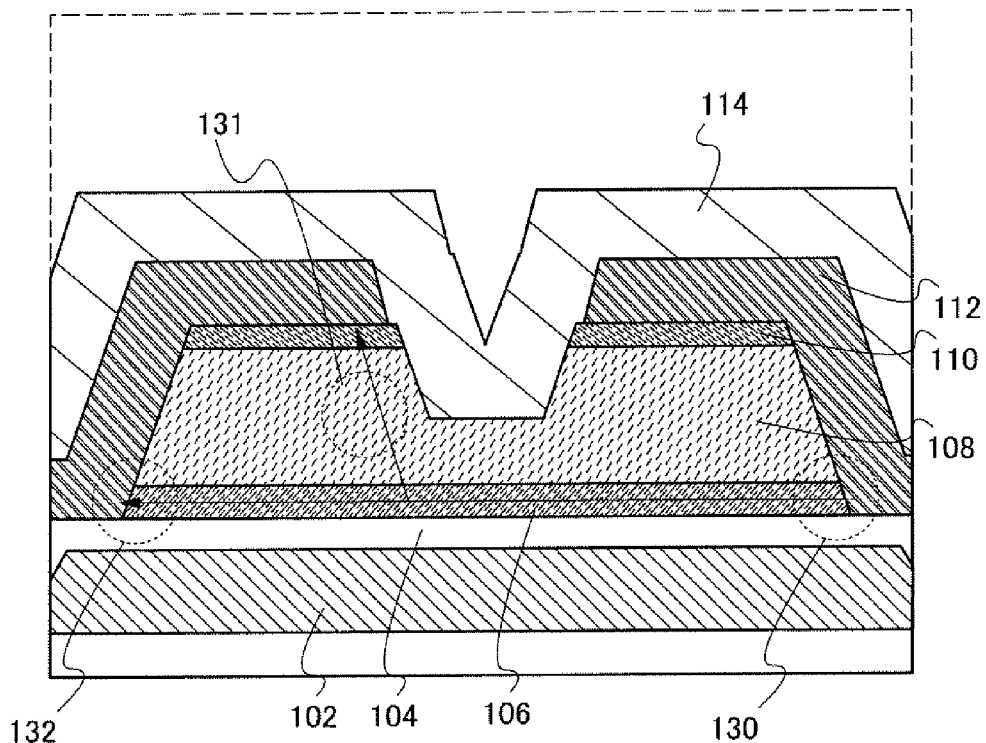
FIGS. 5A and 5B each illustrate a path of off current in a thin film transistor.
Figure 5B:
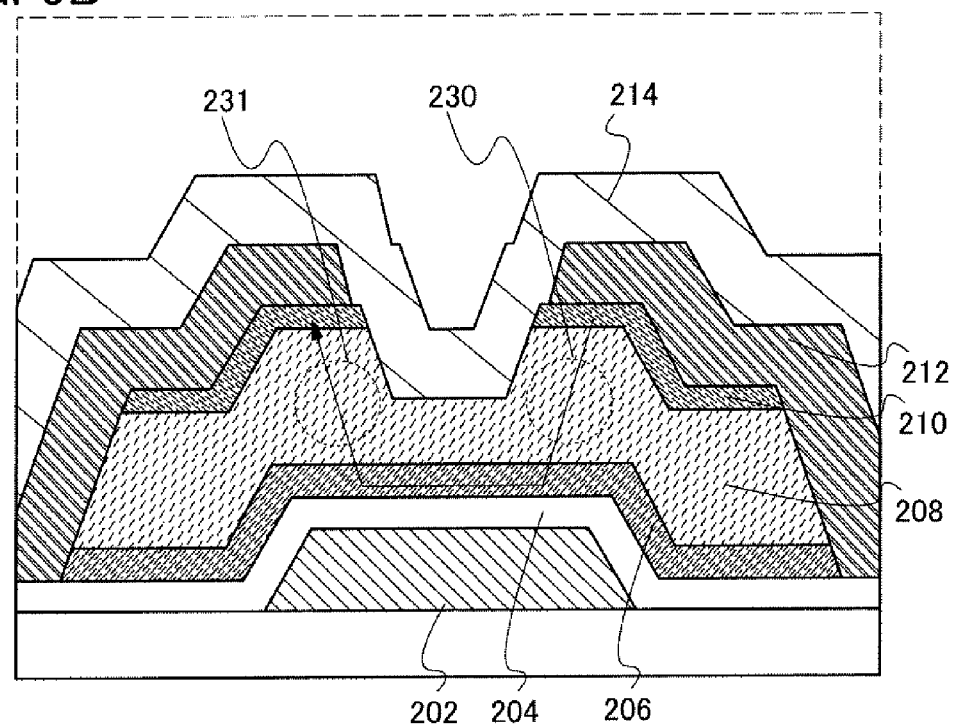

The thin film transistor illustrated in FIGS. 1A and 1B and the thin film transistor illustrated in FIGS. 2A and 2B are compared with reference to FIGS. 5A and 5B.

FIG. 5A is an enlarged view of a part of the thin film transistor illustrated in FIGS. 1A and 1B. FIG. 5B is an enlarged view of a part of the thin film transistor illustrated in FIGS. 2A and 2B. Arrows in FIGS. 5A and 5B each denote a main path of off current.

As described above, when the first semiconductor layer 106 is thin, on current is reduced, and when the first semiconductor layer 106 is thick, a contact area of the first semiconductor layer 106 and the source and drain electrode layers 112 is increased, and off current is increased when the source and drain electrode layers 112 have a high work function. In the thin film transistor which is one embodiment of the present invention, since the source and drain electrode layers 112 are formed using a material with a low work function, the first semiconductor layer 106 can have a thickness necessary for the thin film transistor to obtain a sufficient on current. Therefore, the on current can be increased compared to a conventional thin film transistor.

In FIG. 5A, there is a portion 130 where a part of the first semiconductor layer 106 and a part of the source or drain electrode layer 112 (the drain electrode side) are in contact with each other. Holes are injected from the portion 130, and current flows through the first semiconductor layer 106. It is conceivable that the current is roughly divided into a current which flows through a portion 131 toward the impurity semiconductor layer 110 serving as a source region and a current which flows toward a portion 132 where a part of the first semiconductor layer 106 and a part of the source or drain electrode layer 112 are in contact with each other, and these two kinds of currents mainly flow. Further, it is probable that holes injected from the portion 130 and electrons injected from the source recombine in the portion 131.

In FIG. 5B, it is conceivable that carriers are generated in a portion 230 in the second semiconductor layer 208, which is in the vicinity of a drain, and off current due to these carriers mainly flows. In the portion 230, holes and electrons are generated and thereby a depletion layer is formed, and the electrons flow toward the drain and the holes flow toward the first semiconductor layer 206, whereby current flows. It is probable that holes flow through the first semiconductor layer 206 and recombine with electrons from a source in a portion 231.

Figure 6:
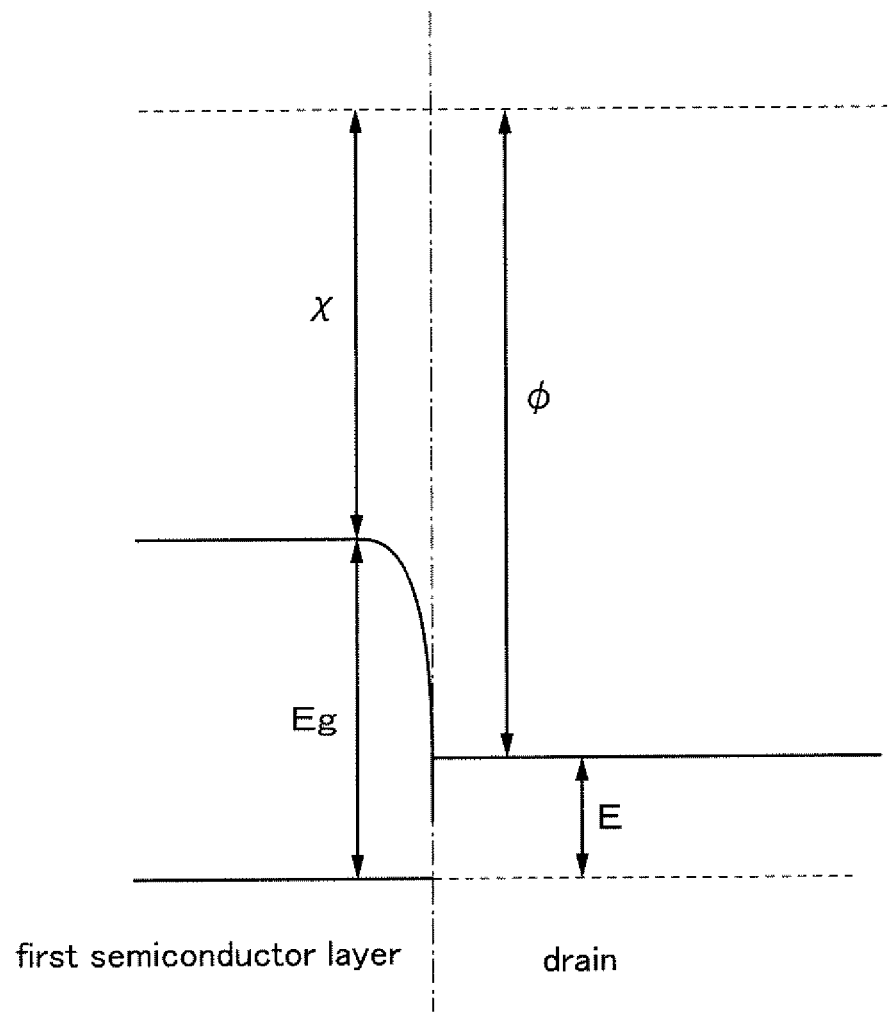
FIG. 6 illustrates a band structure.

A band structure of the portion 130 where a part of the first semiconductor layer 106 is in contact with a part of the source or drain electrode layer 112 is considered. FIG. 6 is a schematic view of the band structure of the portion 130.

In FIG. 6, $\phi$ is a work function of a material for forming the source and drain electrode layers 112, $\chi$ is an electron affinity of the first semiconductor layer 106 (a difference between a vacuum level and a bottom of a mobility edge of the first semiconductor layer 106). $E_g$ is a width of a forbidden band of the first semiconductor layer 106. A level of a potential barrier at a boundary between the first semiconductor layer 106 and the source or drain electrode layer 112 is E. These satisfy the following equation (1).

$$E = \chi + E_g - \phi \qquad \text{equation (1):}$$

As the level E of the potential barrier at the boundary is smaller, more holes are easily injected to the first semiconductor layer 106 and current flows easily. Accordingly, when the width $E_g$ of the forbidden band of the first semiconductor layer 106 is wide, the electron affinity $\chi$ of the first semiconductor layer 106 is large, and the work function $\phi$ of the material for forming the source and drain electrode layers 112 is low, the level E of the potential barrier at the boundary is increased, which means that conduction through the portion 130 where a part of the first semiconductor layer 106 and a part of the source or drain electrode layer 112 are in contact with each other does not occur easily.

Figure 7A:
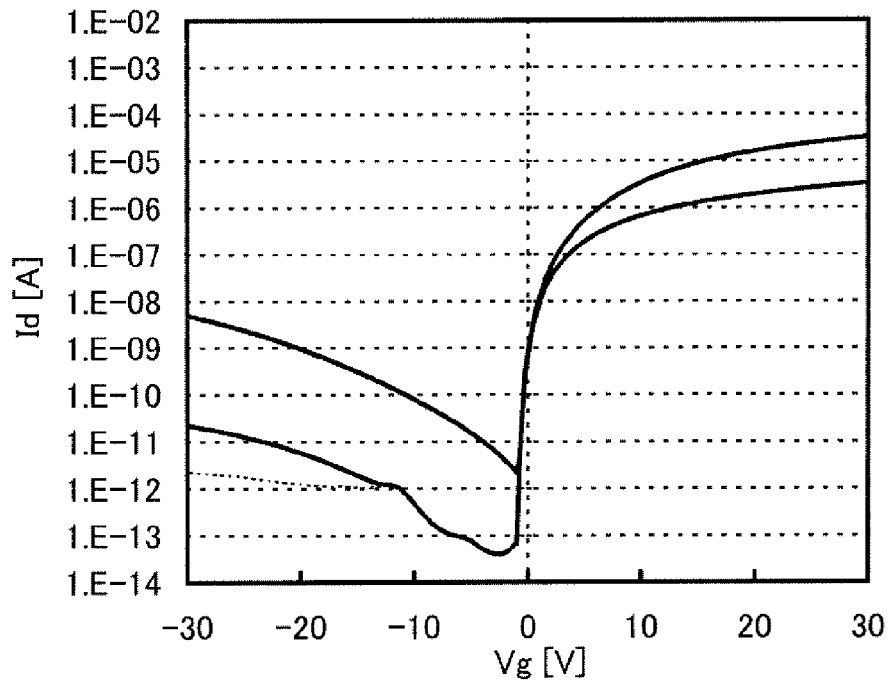
FIGS. 7A and 7B show electric characteristics of thin film transistors.
Figure 7B:
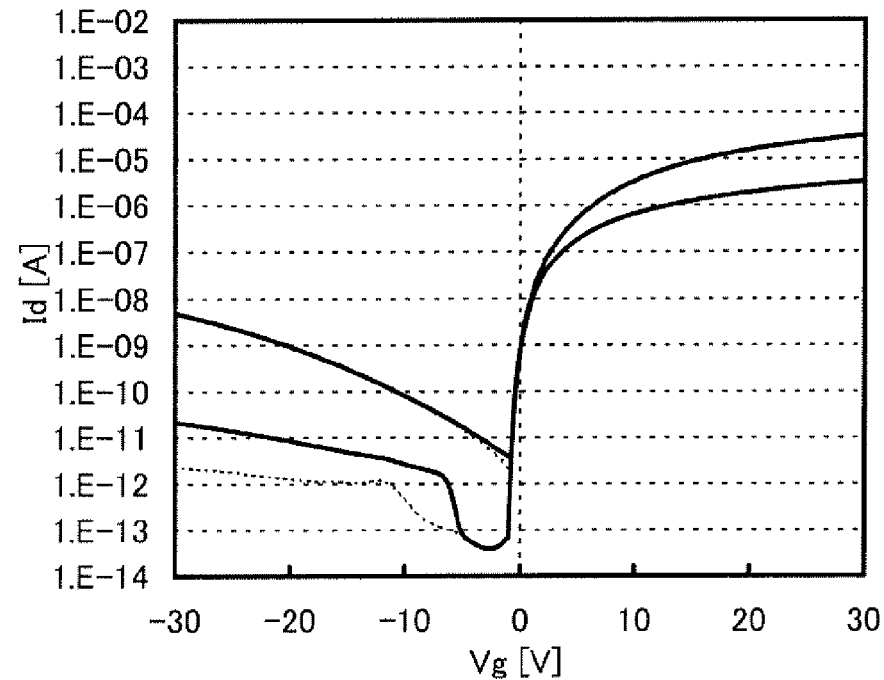
Figure 8:
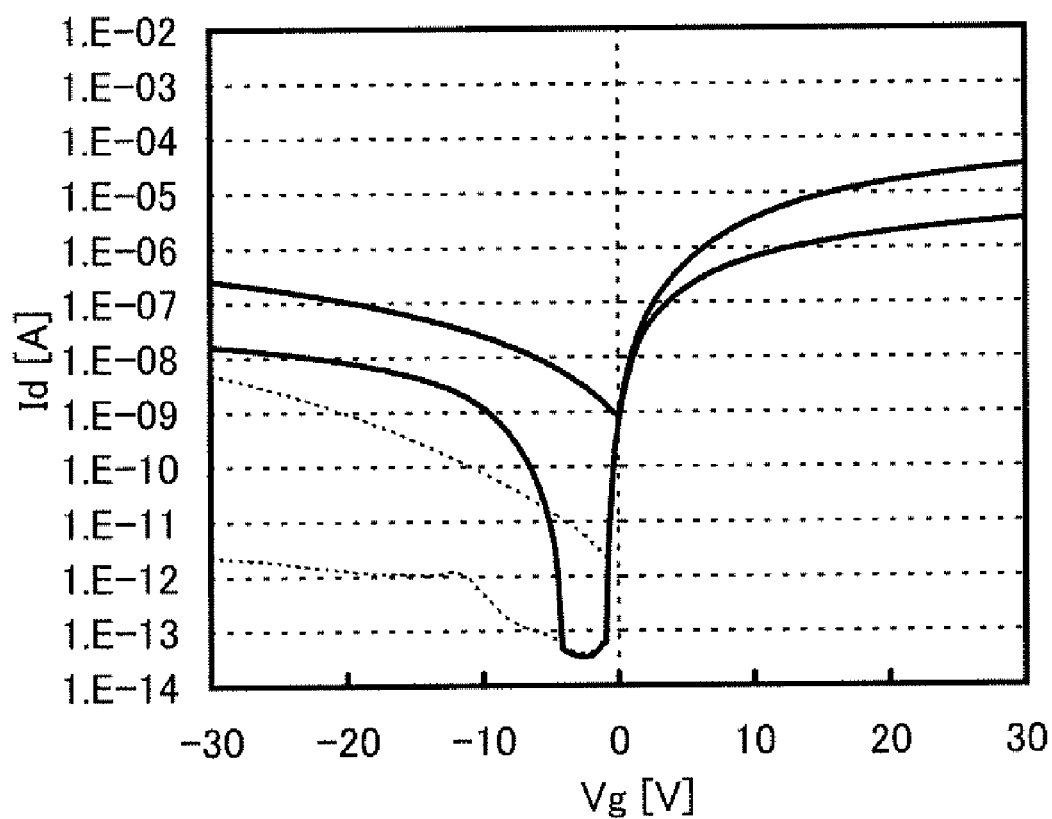
FIG. 8 shows electric characteristics of a thin film transistor.

Therefore, the source and drain electrode layers 112 are preferably formed with a material with a low work function $\phi$ in order to reduce current which flows through the portion 130 where a part of the first semiconductor layer 106 and a part of the source or drain electrode layer 112 are in contact with each other. In order to confirm this, calculation is conducted by setting the work function ϕ of the material for forming the source and drain electrode layers 112 in the structure of FIG. 5A at 3.9 eV, 4.2 eV, and 4.5 eV. Other parameters are unchanged. FIGS. 7A and 7B and FIG. 8 show the results. Note that the channel length L (the distance between the source region and the drain region formed with the pair of impurity semiconductor layers 110) is 4 μm, the channel width W (the width of the impurity semiconductor layer 110) is 20 μm, and the drain voltage $V_d$ is set at 1V and 10V here.

FIG. 7A shows an I-V curve where ϕ=3.9 eV. FIG. 7B shows an I-V curve where ϕ=4.2 eV. FIG. 8 shows an I-V curve where ϕ=4.5 eV. As is clear from FIGS. 7A and 7B and FIG. 8, there is a tendency that off current gets larger as the work function ϕ is higher.

Figure 9A:
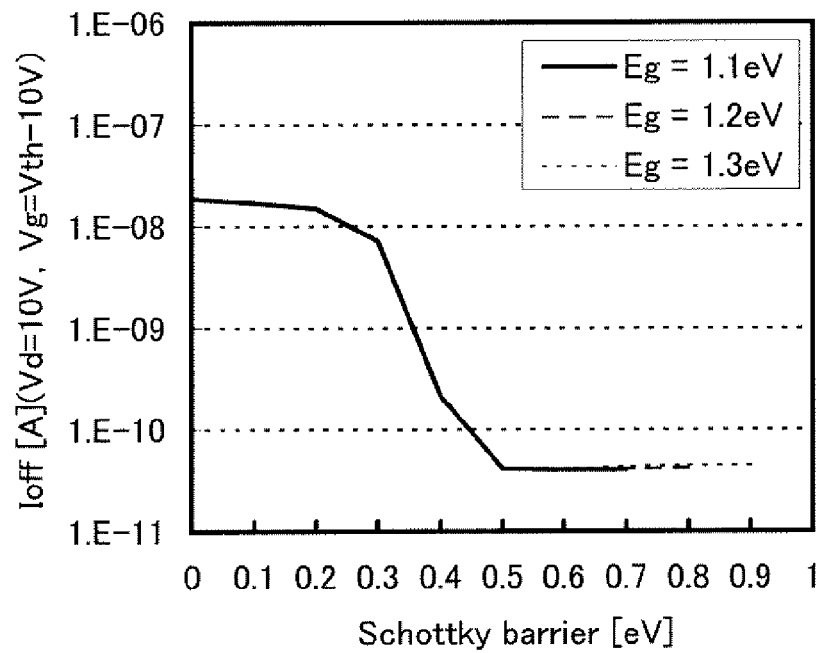
FIGS. 9A and 9B show electric characteristics of thin film transistors.
Figure 9B:
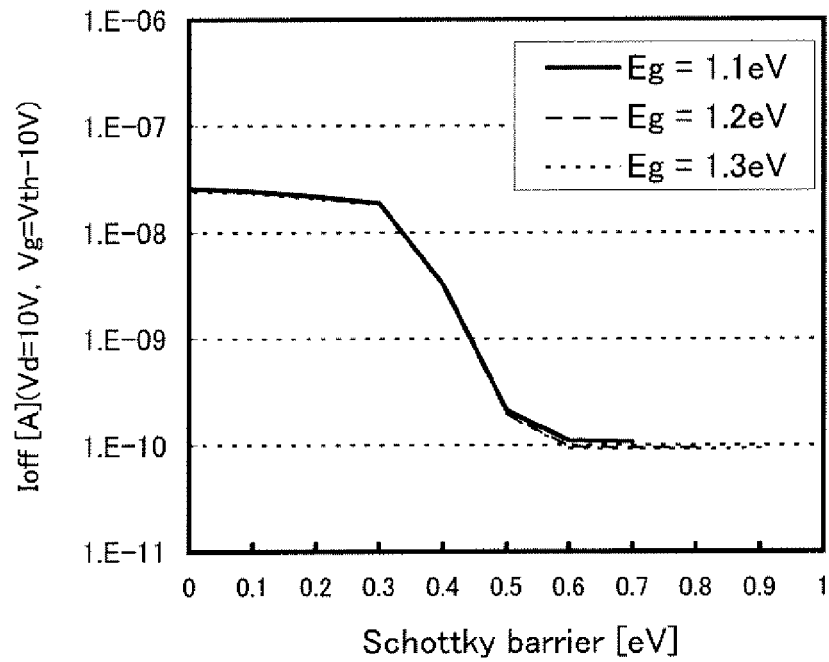

FIGS. 9A and 9B each show an off current $I_{off}$ (vertical axis) with respect to the potential barrier (also referred to as Schottky barrier) E (horizontal axis) in the case where $E_g$ is 1.1 eV to 1.3 eV. Here, the drain voltage $V_d$ is 10 V, and the gate voltage $V_g$ is $V_{th}$–10 V. FIG. 9A is a graph at 27° C. and FIG. 9B is a graph at 85° C. According to FIGS. 9A and 9B, the potential barrier E of greater than or equal to 0.5 eV is enough to reduce the off current, regardless of the temperature. Note that the channel length L (the distance between the source region and the drain region formed with the pair of impurity semiconductor layers 110) is 4 μm, and the channel width W (the width of the impurity semiconductor layer 110) is 20 μm here. $E_g$ of 1.1 eV to 1.3 eV in FIGS. 9A and 9B approximately correspond to energy gap of a microcrystalline semiconductor.

Work functions of several materials are listed in Table 1 but not limited thereto.

TABLE 1

| element | Work function (eV) |
|---|---|
| aluminum | 4.25 |
| silicon | 4.8 |
| titanium | 3.45 |
| chromium | 4.58 |
| nickel | 4.5 |
| copper | 4.4 |
| yttrium | 3.3 |
| molybdenum | 4.3 |
| tantalum | 4.12 |
| tungsten | 4.54 |
| bismuth | 4.4 |
| titanium nitride | 2.92 |

As a material used for at least a part of the source and drain electrode layers 112, yttrium, titanium, or titanium nitride which is a nitride of titanium is preferable among the materials listed in Table 1. Alternatively, a mixture thereof may be used. In particular, titanium containing a rare earth element is preferable. It is most preferable to use titanium containing one or both of yttrium and zirconium at 0.2 wt % to 20 wt % inclusive. This is because yttrium has a very low work function and zirconium has a low work function and physical and chemical properties similar to titanium. By mixture of one or both of yttrium and zirconium into titanium, cost can be decreased compared to the case where only one or both of yttrium and zirconium are used.

By using such a material having a low work function, on current of the thin film transistor can be increased. This applies not only to the thin film transistor illustrated in FIGS. 1A and 1B. Also in the thin film transistors illustrated in FIGS. 2A and 2B and FIGS. 4A and 4B, on current of the thin film transistor can be increased by using a material with a low work function.

Figure 10A:
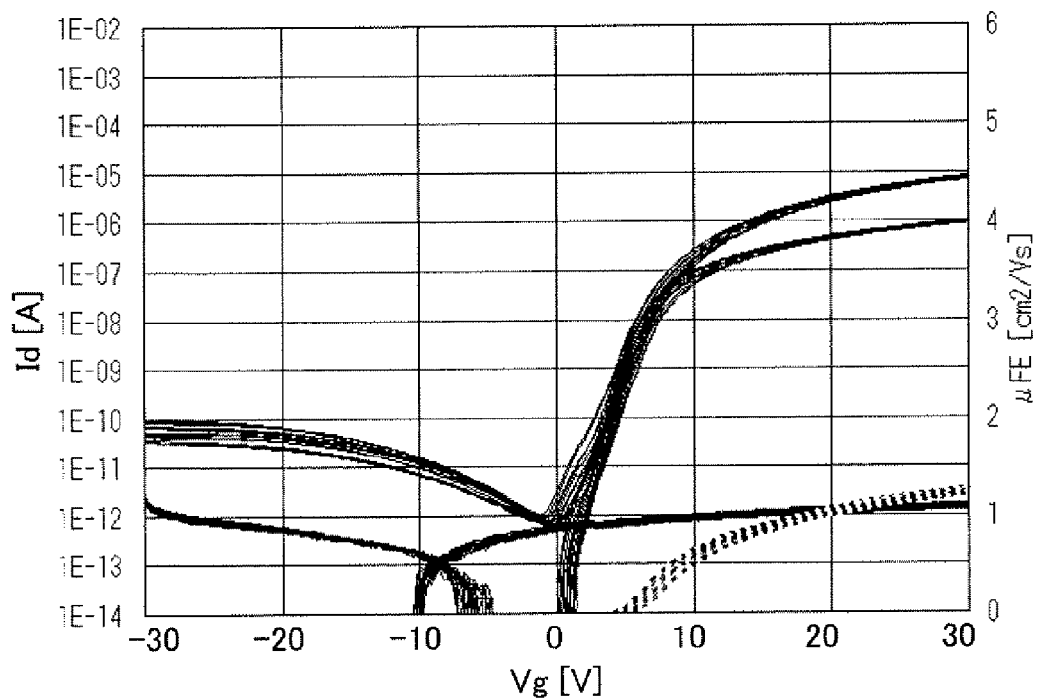
FIGS. 10A and 10B show electric characteristics of thin film transistors.
Figure 10B:
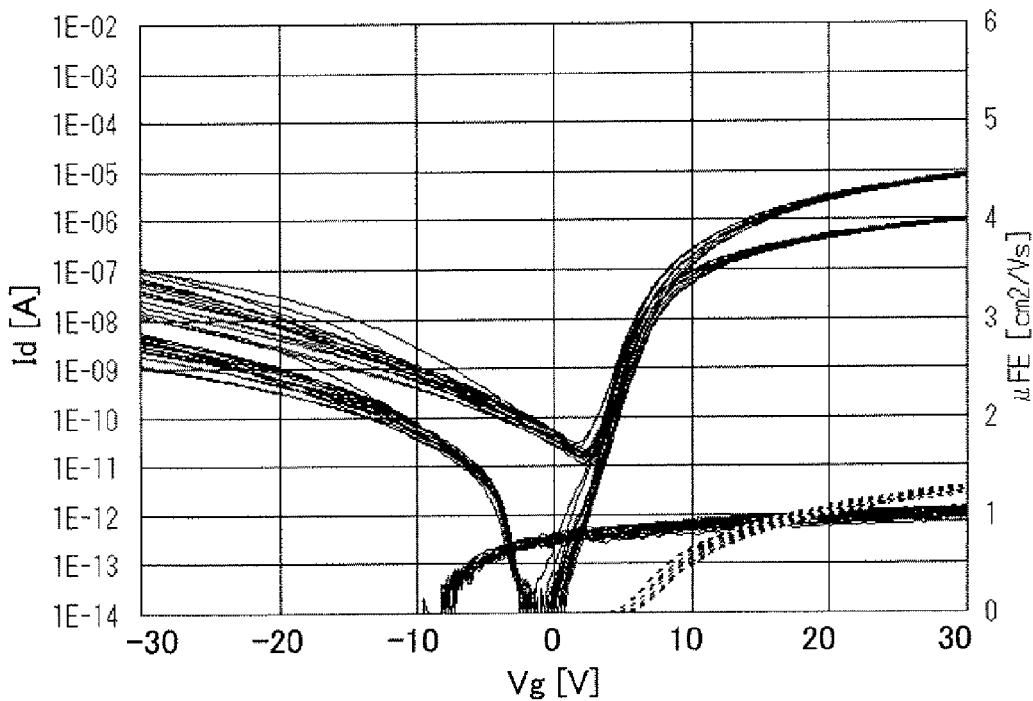
Figure 11A:
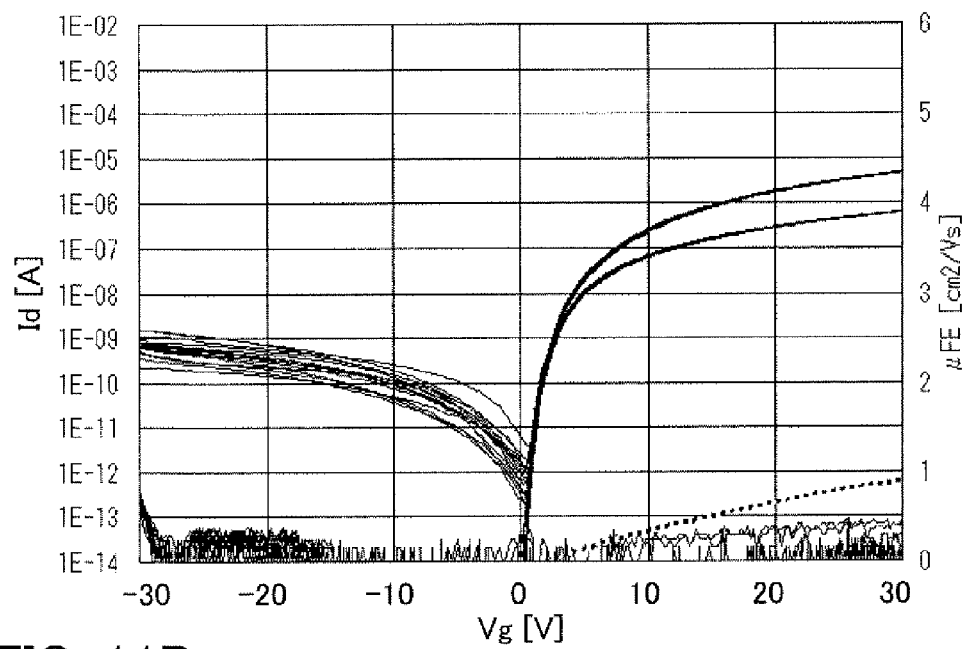
FIGS. 11A and 11B show electric characteristics of thin film transistors.
Figure 11B:
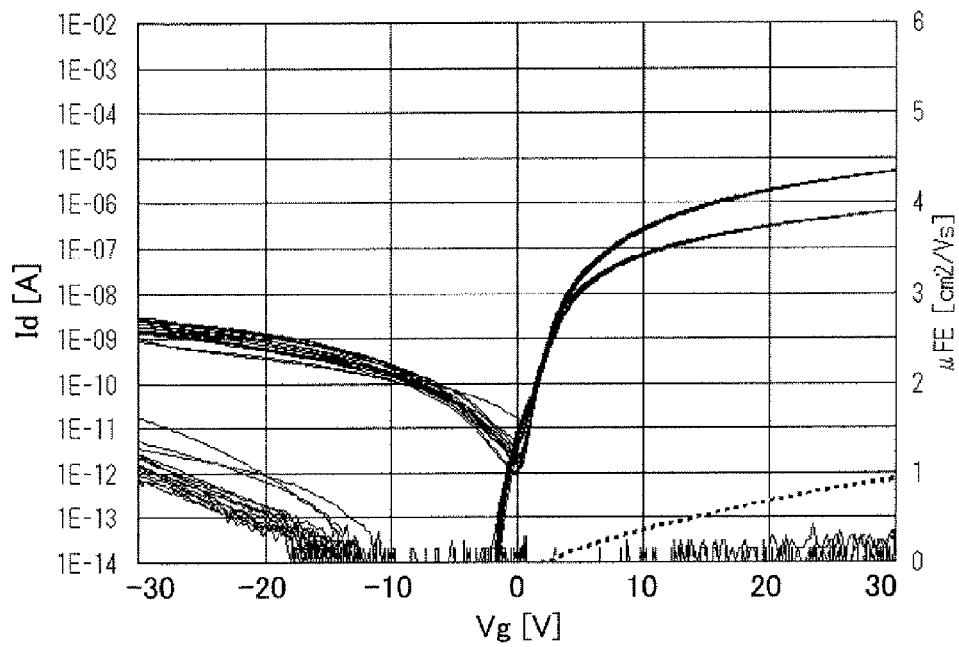

FIGS. 10A and 10B and FIGS. 11A and 11B each show an I-V curve of a thin film transistor in which source and drain electrode layers are formed using titanium or molybdenum. That is, FIG. 10A shows an I-V curve of the thin film transistor illustrated in FIGS. 2A and 2B in which the source and drain electrode layers 212 are formed with molybdenum. FIG. 10B shows an I-V curve of the thin film transistor illustrated in FIGS. 1A and 1B in which the source and drain electrode layers 112 are formed with molybdenum. FIG. 11A shows an I-V curve of the thin film transistor illustrated in FIGS. 2A and 2B in which the source and drain electrode layers 212 are formed with titanium. FIG. 11B shows an I-V curve of the thin film transistor illustrated in FIGS. 1A and 1B in which the source and drain electrode layers 112 are formed with titanium.

Comparing FIGS. 10A and 10B shows that off current of the thin film transistor illustrated in FIGS. 1A and 1B is higher than that of the thin film transistor illustrated in FIGS. 2A and 2B in the case where the source and drain electrode layers are formed using molybdenum.

Comparing FIGS. 11A and 11B shows that there is no large difference in off current between the thin film transistor illustrated in FIGS. 1A and 1B and the thin film transistor illustrated in FIGS. 2A and 2B in the case where the source and drain electrode layers are formed using titanium. Therefore, even in the thin film transistor illustrated in FIGS. 1A and 1B in which the semiconductor layer can be shielded from light, off current can be suppressed. That is, a thin film transistor with small light leakage current and small off current can be obtained.

As described above, when the source and drain electrode layers 112 (specifically, a part of the source or drain electrode layer 112, which is in contact with the first semiconductor layer 106) are formed with a metal material with a low work function, leakage current through the portion 130 where a part of the first semiconductor layer 106 and a part of the source or drain electrode layer 112 are in contact with each other, which occurs by overlap of the entire surface of the semiconductor layer with the gate electrode layer, can be prevented. Further, since light leakage current can be reduced by overlap of the entire surface of the semiconductor layer with the gate electrode layer 102, a thin film transistor with small light leakage current and small off current can be obtained.

Next, a method for forming a preferable mode of each of the first and second semiconductor layers 106 and 108 will be described.

A semiconductor film which is to be the first semiconductor layer 106 is formed using glow discharge plasma in a reaction chamber of a plasma CVD apparatus with the use of a mixture of hydrogen and a deposition gas containing silicon (such as silane ($SiH_4$)). Alternatively, the semiconductor film is formed using glow discharge plasma with the use of a mixture of a deposition gas containing silicon, hydrogen, and a rare gas such as helium, neon, or krypton. The flow rate of hydrogen is 10 to 2000 times, preferably 10 to 200 times that of the deposition gas containing silicon. The semiconductor film which is to be the first semiconductor layer 106 is formed to a thickness of 1 nm to 20 nm inclusive, preferably 3 nm to 10 nm inclusive.

Alternatively, a deposition gas such as germane ($GeH_4$) or digermane ($Ge_2H_6$) may be used, and the semiconductor film which is to be the first semiconductor layer 106 may be formed using germanium.

Before the semiconductor film which is to be the first semiconductor layer 106 is formed, impurity elements in the reaction chamber of the plasma CVD apparatus are removed by introducing a deposition gas containing silicon or germanium with the air in the reaction chamber exhausted, so that the impurity elements at the interface of the films which are formed can be reduced. Accordingly, electric characteristics of the thin film transistor can be improved.

A semiconductor film which is to be the second semiconductor layer 108 is formed using glow discharge plasma in a reaction chamber of the plasma CVD apparatus with the use of a mixture of hydrogen and a deposition gas containing silicon. At this time, the flow rate of hydrogen with respect to a deposition gas containing silicon is reduced (that is, a dilution ratio is reduced) compared to a deposition condition of the semiconductor film which is to be the first semiconductor layer 106. Accordingly, the crystal growth is suppressed and the semiconductor film which is to be the second semiconductor layer 108 which does not contain a microcrystalline semiconductor region is formed as the film is deposited.

At the initial stage of deposition of the semiconductor film which is to be the second semiconductor layer 108, the flow rate of hydrogen with respect to the deposition gas containing silicon is reduced (that is, the dilution ratio is reduced) from the deposition condition of the semiconductor film which is to be the first semiconductor layer 106, whereby a microcrystalline semiconductor region can remain in the semiconductor film which is to be the second semiconductor layer 108. In addition, the flow rate of hydrogen with respect to the deposition gas containing silicon is further reduced (that is, the dilution ratio is further reduced) from the above condition, so that the semiconductor film which is to be the second semiconductor layer 108 can be a semiconductor film which is "a layer containing an amorphous semiconductor". Furthermore, the flow rate of hydrogen with respect to the deposition gas containing silicon is further reduced (that is, the dilution ratio is further reduced) from the above condition and a gas containing nitrogen is mixed, so that an amorphous semiconductor region in the second semiconductor layer 108 can be enlarged. The semiconductor film which is to be the second semiconductor layer 108 may also be formed using germanium.

In addition, at the initial stage of the deposition of the semiconductor film which is to be the second semiconductor layer 108, the semiconductor film which is to be the first semiconductor layer 106 is used as a seed crystal and the film is deposited on the entire surface. After that, the crystal growth is partially suppressed, and a conical or pyramidal microcrystalline semiconductor region grows (in the middle stage of the deposition). Further, the crystal growth of the conical or pyramidal microcrystalline semiconductor region is suppressed, and the semiconductor film which is to be the second semiconductor layer 108 which does not contain a microcrystalline semiconductor region is formed in an upper layer (in the later stage of the deposition).

Note that the first semiconductor layer 106 is not limited to a crystalline semiconductor layer as long as a semiconductor layer whose carrier mobility is higher than that of the second semiconductor layer 108 is used, for example.

There is a tendency that off current is increased as the width of a region where the gate electrode layer 102 and the source and drain electrode layers 112 overlap with each other is larger.

Next, a method for manufacturing the thin film transistor illustrated in FIGS. 1A and 1B is described with reference to the drawings.

First, the gate electrode layer 102 is formed over the substrate 100. As the substrate 100, any of the following substrates can be used: an alkali-free glass substrate formed of barium borosilicate glass, aluminoborosilicate glass, aluminosilicate glass, or the like by a fusion method or a float method; a ceramic substrate; a plastic substrate having heat resistance enough to withstand a process temperature of this manufacturing process; and the like. Alternatively, a metal substrate of a stainless steel alloy or the like with the surface provided with an insulating layer may be used. That is, a substrate having an insulating surface is used as the substrate 100. When the substrate 100 is a mother glass, the substrate may have any size of from the first generation (e.g., 320 mm×400 mm) to the tenth generation (e.g., 2950 mm×3400 mm).

The gate electrode layer 102 can be formed using a metal material such as molybdenum, titanium, chromium, tantalum, tungsten, aluminum, copper, neodymium, or scandium or an alloy material containing any of these materials as a main component as a single layer or a plurality of layers stacked. For example, a two-layer structure in which a molybdenum layer or a titanium layer is stacked over an aluminum layer is preferably used. When a metal layer functioning as a barrier layer is stacked over a layer formed of a material with low electric resistance, electric resistance can be reduced and a metal element from the metal layer can be prevented from diffusing into the semiconductor layer. For example, in the case where a molybdenum layer is stacked over an Al—Nd alloy layer, a conductive layer with excellent heat resistance and low electric resistance can be formed. Alternatively, a stacked layer structure of three or more layers may be used.

Figure 12A:
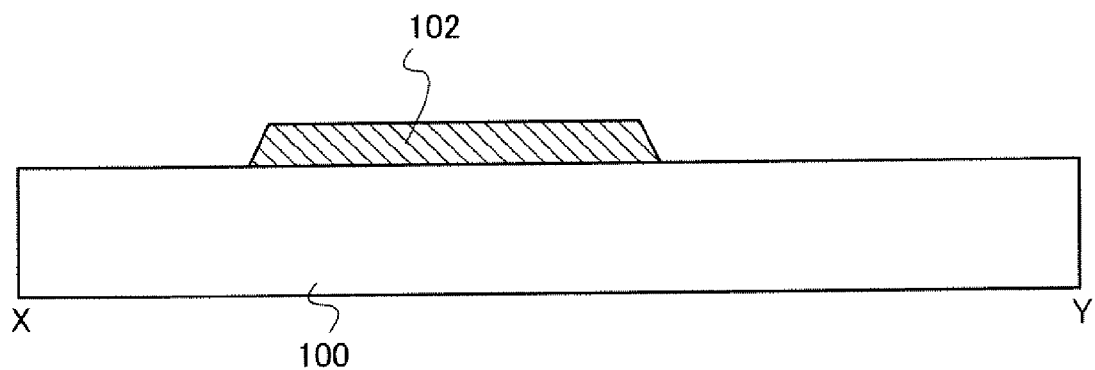
FIGS. 12A to 12C illustrate a method for manufacturing a thin film transistor.

The gate electrode layer 102 can be formed in such a way that a conductive film is formed over the substrate 100 by a sputtering method or a vacuum evaporation method, a resist mask is formed over the conductive film by a photolithography method, an inkjet method, or the like, and then the conductive film is etched by using the resist mask (FIG. 12A). Alternatively, the gate electrode layer 102 can be formed by discharging a conductive nanopaste of silver, gold, copper, or the like over the substrate by an inkjet method and baking the conductive nanopaste. Note that as a barrier metal for increasing adhesion between the gate electrode layer 102 and the substrate 100 and/or preventing diffusion of a material used for the gate electrode layer 102, a nitride layer of any of the aforementioned metal materials may be provided between the substrate 100 and the gate electrode layer 102. Here, the gate electrode layer 102 is formed by forming the conductive film over the substrate 100 and etching the conductive film by using a resist mask formed using a photomask.

Since the semiconductor layer and a source wiring (a signal line) are formed over the gate electrode layer 102 in later steps, the gate electrode layer 102 is preferably formed to have a tapered side surface so that the semiconductor layer and the source wiring thereover are not disconnected at a step portion. In addition, in this step, a gate wiring (a scan line) can be formed at the same time. Further, a capacitor line included in a pixel portion can also be formed. Note that a "scan line" refers to a wiring to select a pixel.

Next, the gate insulating layer 104 is formed to cover the gate electrode layer 102, and a first semiconductor film 150 which is to be the first semiconductor layer 106, a second semiconductor film 152 which is to be the second semiconductor layer 108, and an impurity semiconductor film 154 which is to be the impurity semiconductor layers 110 are sequentially stacked over the gate insulating layer 104. Note that it is preferable that at least the gate insulating layer 104, the first semiconductor film 150, and the second semiconductor film 152 be formed successively. It is more preferable to successively form the films up to the impurity semiconductor film 154. By forming at least the gate insulating layer 104, the first semiconductor film 150, and the second semiconductor film 152 successively without being exposed to the air, each interface of stacked films can be formed without contaminating these layers by an atmospheric constituent or an impurity element contained in the air. Therefore, variations in electric characteristics of the thin film transistor can be reduced, so that a thin film transistor having high reliability can be manufactured with high yield.

The gate insulating layer 104 can be formed using silicon oxide, silicon nitride, silicon oxynitride, or silicon nitride oxide by a CVD method, a sputtering method, or the like. The gate insulating layer 104 is preferably formed using silicon oxide. In particular, when the gate insulating layer 104 is formed using a silicon oxide layer that is formed using tetraethoxysilane (TEOS) (Si(OC$_2$H$_5$)$_4$) for a source gas and the semiconductor layer that is formed in contact with the gate insulating layer 104 is crystalline, the crystallinity of the semiconductor layer can be increased. The gate insulating layer 104 may have either a single-layer structure or a stacked-layer structure of the aforementioned materials. For example, the gate insulating layer 104 is formed to a thickness of greater than or equal to 50 nm, preferably 50 nm to 400 nm inclusive, more preferably 150 nm to 300 nm inclusive. The use of a silicon nitride oxide layer can prevent alkali metal or the like contained in the substrate 100 from entering the first semiconductor layer 106. Further, the use of a silicon oxynitride layer can prevent a hillock which is generated in the case of using aluminum for the gate electrode layer 102 and also prevent the gate electrode layer 102 from being oxidized. The gate insulating layer 104 is preferably formed with the use of a plasma CVD apparatus with a frequency of greater than or equal to 1 GHz.

After forming the gate insulating layer 104 and before forming the first semiconductor film 150, a layer for increasing adhesion and/or preventing oxidation may be formed over the gate insulating layer 104. As such a layer for preventing oxidation and/or the like, for example, a stacked layer in which a silicon oxynitride layer is interposed between silicon nitride layers can be given.

The first semiconductor layer 106 functions as a channel formation region of the thin film transistor. The first semiconductor layer 106 is a crystalline semiconductor layer here. That is, the first semiconductor film 150 is a crystalline semiconductor film here. The crystalline semiconductor film can be formed using microcrystalline silicon by a plasma CVD method or the like.

In this embodiment, the carrier mobility of a crystalline semiconductor layer is about 2 times to 20 times that of an amorphous semiconductor layer. Therefore, compared to a thin film transistor formed with an amorphous semiconductor layer, the slope at the rising point of an I-V curve of a thin film transistor formed with a crystalline semiconductor layer is steeper. Here, "gate voltage" means a potential difference between a potential of a source electrode and a potential of a gate electrode, and "drain current" means a current flowing between the source electrode and the drain electrode. Therefore, a thin film transistor in which a crystalline semiconductor layer is used for a channel formation region has high response characteristics as a switching element and can operate at high speed. Thus, with the use of a thin film transistor in which a crystalline semiconductor layer is used for a channel formation region as a switching element of a display device, the area of the channel formation region, i.e., the area of the thin film transistor can be reduced. Furthermore, when a part or whole of a driver circuit is formed over the same substrate as a pixel portion, a system-on-panel can be obtained.

Further, the crystalline semiconductor layer often exhibits low n-type conductivity even when an impurity element for controlling valence electrons is not added thereto. Thus, the threshold voltage $V_{th}$ of the thin film transistor may be controlled by adding an impurity element imparting p-type conductivity (e.g., boron) to the crystalline semiconductor layer that serves as the channel formation region of the thin film transistor at the same time as or after forming the crystalline semiconductor layer. A typical example of an impurity element imparting p-type conductivity is boron, and an impurity gas such as diborane (B$_2$H$_6$) or boron trifluoride (BF$_3$) may be mixed into silicon hydride, at a proportion of 1 ppm to 1000 ppm, preferably, 1 ppm to 100 ppm. The concentration of boron in the crystalline semiconductor layer is preferably set at from $1\times10^{14}$ atoms/cm$^3$ to $6\times10^{16}$ atoms/cm$^3$.

The crystalline semiconductor layer is formed with a thickness of 2 nm to 60 nm inclusive, preferably 10 nm to 30 nm inclusive. The thickness of the crystalline semiconductor layer can be controlled, for example, with the flow rate of silane and the deposition time in a process of forming the crystalline semiconductor film. Specifically, components which interrupt crystallization, typified by oxygen or nitrogen, are reduced, and the flow rate of a dilution gas such as hydrogen is increased with respect to that of a deposition gas such as silane. At this time, the flow rate of the dilution gas is 10 times to 2000 times, preferably 50 times to 200 times that of the deposition gas. In such a manner, a so-called microcrystalline semiconductor layer is formed.

The second semiconductor layer 108 serves as a buffer layer which reduces off current. Here, the case will be described, in which the second semiconductor layer 108 is formed with "a layer containing an amorphous semiconductor", that is, a well-ordered semiconductor which has fewer defects and whose tail of a level at a band edge (mobility edge) in the valence band is steep compared to the conventional amorphous semiconductor. Such a semiconductor film is formed in such a manner that, for example, the flow rate of hydrogen with respect to a deposition gas is reduced (that is, a dilution ratio is reduced) in a source gas for forming a crystalline semiconductor film compared to a deposition condition of the first semiconductor film 150, and a plasma CVD method is used and thereby the crystal growth is suppressed. In addition, when nitrogen is contained in a source gas of a crystalline semiconductor film, such a semiconductor film can be easily formed. It is preferable that nitrogen be contained at $1\times10^{20}$ cm$^{-3}$ to $1\times10^{21}$ cm$^{-3}$ in the second semiconductor film 152. At this time, nitrogen is preferably in a state of an NH group. This is because dangling bonds of a semiconductor atom are easily cross-linked with nitrogen or an NH group, and carriers flow without difficulty. Accordingly, a bonding which promotes the carrier transfer is formed in a crystal grain boundary or a defect, whereby the carrier mobility of the second semiconductor layer 108 is increased. Consequently, field-effect mobility and on current of the thin film transistor can be sufficiently high. Note that nitrogen may be in a state of not only an NH group but also in an NH$_2$ group. At this time, the flow rate of a dilution gas is 10 times to 2000 times, preferably 50 times to 200 times that of the deposition gas. Preferably, the flow rate of the dilution gas is lower than that in the case of forming the first semiconductor layer 106.

The oxygen concentration in the second semiconductor film 152 is preferably low. By reducing the oxygen concentration in the second semiconductor film 152, bonding at the interface between the microcrystalline semiconductor region and the amorphous semiconductor region or at the interface between the microcrystalline semiconductor regions which interrupts the carrier transfer can be reduced.

The impurity semiconductor layers 110 can be formed in such a manner that the impurity semiconductor film 154 is formed and then etched. In the case where an n-channel thin film transistor is formed, phosphorus may be added as a typical impurity element, for example, a gas containing phosphine ($PH_3$) may be added to silicon hydride to form the impurity semiconductor layers 110. In order to form a p-channel thin film transistor, boron may be used as a typical impurity element, and a gas containing diborane ($B_2H_6$) may be added to silicon hydride, for example. Further, as the impurity semiconductor film 154, either a crystalline semiconductor or an amorphous semiconductor may be used, but it is preferable to use a crystalline semiconductor. The impurity semiconductor film 154 which is to be the impurity semiconductor layers 110 may have a thickness which enables ohmic contact between the second semiconductor layer 108 and the source and drain electrode layers 112, and may be formed to a thickness of approximately 2 nm to 60 nm inclusive. When the impurity semiconductor film 154 is thinned as much as possible, throughput can be improved. When the impurity semiconductor layers 110 are formed using a crystalline semiconductor, components which interrupt crystallization, typified by oxygen or nitrogen, are reduced, and the flow rate of a dilution gas such as hydrogen is increased with respect to that of a deposition gas such as silane. At this time, when the impurity semiconductor layers 110 are formed using an amorphous semiconductor, the flow rate of a dilution gas is 1 to 10 times, preferably 1 to 5 times that of the deposition gas, whereas, when the impurity semiconductor layers 110 are formed using a crystalline semiconductor, the flow rate of a dilution gas is 10 times to 2000 times, preferably 50 times to 200 times that of the deposition gas. In such a manner, a so-called microcrystalline semiconductor layer is formed.

Figure 12B:
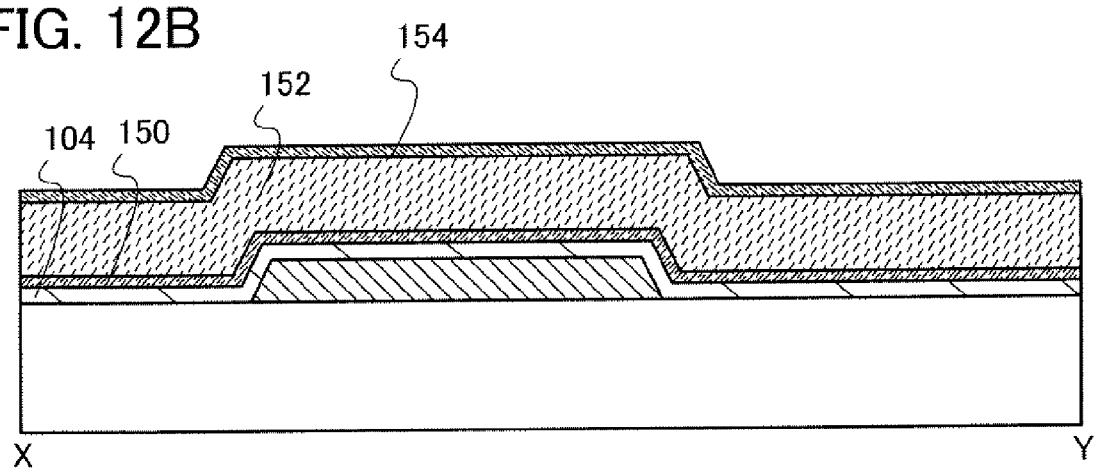

As described above, layers from the gate insulating layer 104 to the impurity semiconductor film 154 are preferably formed successively (FIG. 12B). With a multi-chamber CVD apparatus provided with a plurality of reaction chambers, a reaction chamber can be provided for each kind of deposition film, and a plurality of different films can be formed successively without being exposed to the air.

Figure 13:
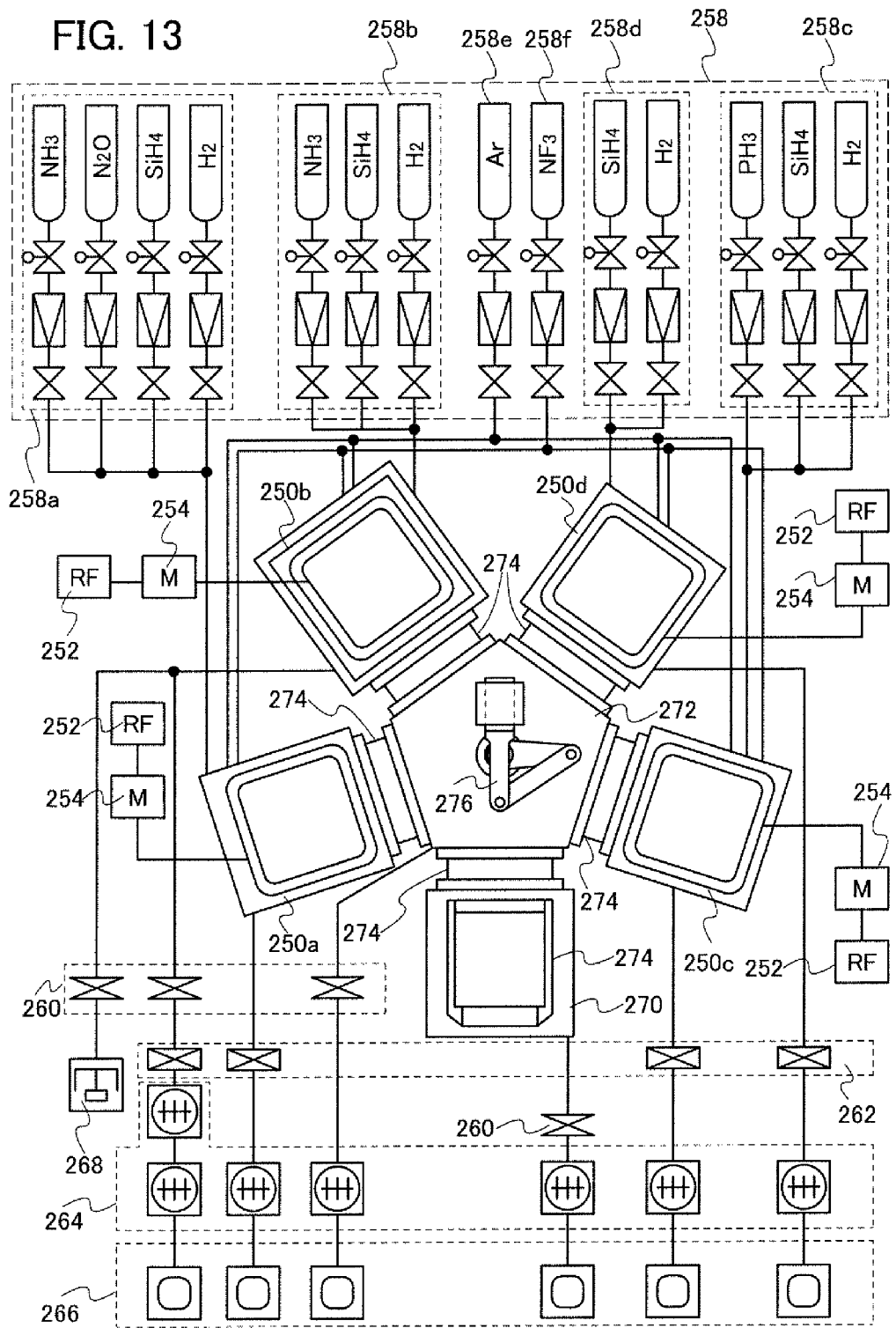
FIG. 13 illustrates a method for manufacturing a thin film transistor.

FIG. 13 is a schematic top cross-sectional view of an example of a multi-chamber plasma CVD apparatus provided with a plurality of reaction chambers. The apparatus is provided with a common chamber 272, a load/unload chamber 270, a first reaction chamber 250a, a second reaction chamber 250b, a third reaction chamber 250c, and a fourth reaction chamber 250d. After the substrate 100 is set in a cassette of the load/unload chamber 270, the substrate 100 is transferred to and from each reaction chamber with a transfer unit 276 of the common chamber 272. A gate valve 274 is provided between the common chamber 272 and each reaction chamber, and between the common chamber 272 and the load/unload chamber, so that treatment performed in each reaction chamber does not interfere with each other. Each reaction chamber can be used for a different purpose, depending on the kind of a thin film to be formed. For example, an insulating film is formed in the first reaction chamber 250a; a semiconductor film is formed in the second reaction chamber 250b and the fourth reaction chamber 250d; and a semiconductor film to which an impurity element imparting one conductivity type is added is formed in the third reaction chamber 250c. Since an optimum deposition temperature varies depending on a thin film to be formed, the reaction chambers are separated to facilitate the control of deposition temperatures, and thus each thin film can be formed at its optimal temperature. Further, the same kind of films can be repeatedly deposited, so that influence of residual impurities attributed to a film formed previously can be avoided. One film may be formed with one reaction chamber, or a plurality of films with similar compositions, such as a crystalline semiconductor film and an amorphous semiconductor film, may be formed with one reaction chamber.

A turbo-molecular pump 264 and a dry pump 266 are connected to each reaction chamber as an exhaust unit. The exhaust unit is not limited to a combination of these vacuum pumps and can employ other vacuum pumps as long as they can evacuate the reaction chamber to a degree of vacuum of about $10^{-1}$ Pa to $10^{-5}$ Pa. Note that a cryopump 268 is preferably connected to the second reaction chamber 250b so that the pressure in the reaction chamber can be reduced to about $10^{-5}$ Pa or less. A butterfly valve 260 and/or a conductance valve 262 are/is provided between the exhaust unit and each reaction chamber. The butterfly valve 260 can block a path between the exhaust unit and the reaction chamber. Further, the conductance valve 262 can control the pumping speed and adjust the pressure in each reaction chamber.

The cryopump 268 connected to the second reaction chamber 250b can also reduce the pressure in the reaction chamber to lower than $10^{-5}$ Pa (for example, an ultrahigh vacuum). In this embodiment, the reaction chamber 250b is evacuated to a pressure of lower than $10^{-5}$ Pa, thereby preventing an atmospheric component such as oxygen from being mixed into the semiconductor film. Consequently, the oxygen concentration in the semiconductor film can be less than or equal to $1 \times 10^{16}$ $cm^{-3}$.

A gas supply unit 258 includes a cylinder filled with a source gas, a stop valve, a mass flow controller, and the like. A gas supply unit 258a is connected to the first reaction chamber 250a and supplies a gas for forming the insulating film. A gas supply unit 258b is connected to the second reaction chamber 250b and supplies a gas for forming the semiconductor film. A gas supply unit 258c is connected to the third reaction chamber 250c and supplies a semiconductor source gas to which an impurity element imparting n-type conductivity is added, for example. A gas supply unit 258d is connected to the fourth reaction chamber 250d and supplies a gas for forming the semiconductor film. A gas supply unit 258e supplies argon. A gas supply unit 258f supplies an etching gas (a $NF_3$ gas in this example) used for cleaning of the inside of the reaction chambers. Since an argon gas and an etching gas used for cleaning are used in all the reaction chambers, the gas supply unit 258e and the gas supply unit 258f are preferably connected to all the reaction chambers.

A high-frequency power supply unit for producing plasma is connected to each reaction chamber. The high-frequency power supply unit includes a high-frequency power source 252 and a matching box 254. A microwave generator may also be connected to each reaction chamber, without limitation to the above. For example, RF (13.56 MHz) plasma, VHF (30 MHz to 300 MHz) plasma, or microwave (2.45 GHz) plasma is generated. Note that, by generating RF plasma and VHF plasma at the same time (two frequency excitation), the deposition rate can be improved.

The plasma used here is preferably pulse modulation plasma. With the use of the pulse modulation plasma, the deposition rate in film formation can be improved, generation of particles in film formation can be suppressed, and the quality and thickness uniformity of the semiconductor film which is formed can be improved. In addition, the amount of generation of UV rays in plasma generation can be suppressed, and the number of defects in the semiconductor film which is formed can be reduced.

A crystalline semiconductor film, an amorphous semiconductor film, and an impurity semiconductor film to which an impurity element imparting one conductivity type is added may be formed successively in one reaction chamber. Specifically, a substrate provided with a gate insulating film is placed in a reaction chamber, and a crystalline semiconductor film, an amorphous semiconductor film, and a semiconductor film to which an impurity element imparting one conductivity type is added (an impurity semiconductor film) are formed therein successively. By forming the crystalline semiconductor film and the amorphous semiconductor film successively in one reaction chamber, an interface with little crystal distortion can be formed. Thus, formation of an intended level at the interface can be prevented. Further, an atmospheric component that can be mixed into the interface can be reduced.

In addition, although not illustrated, a spare chamber may be connected to the multi chamber plasma CVD apparatus of FIG. 13. When a substrate is preheated in the spare chamber before film formation, heating time that is required before deposition of a film in each reaction chamber can be shortened, whereby throughput can be improved.

By successive deposition as described above, a plurality of films can be stacked without any contamination of the interfaces thereof due to a contaminant impurity element. Thus, variation in electric characteristics of the thin film transistor can be reduced.

When the plasma CVD apparatus described above is used, a film of one kind or plural kinds of films of similar compositions can be formed successively without being exposed to the air in each reaction chamber. Thus, a plurality of films can be stacked without any contamination of interfaces thereof due to a residue of a film which has already been formed or an impurity element contained in the air.

The inside of the reaction chamber of the plasma CVD apparatus may be cleaned with fluorine radicals. In addition, a protective film is preferably formed on the inside of the reaction chamber before film formation.

An apparatus that can be used is not limited to the one illustrated in FIG. 13. For example, a CVD apparatus provided with two reaction chambers may be used. In such a case, one reaction chamber (a first reaction chamber) may be used to form a silicon oxide film using tetraethoxysilane (TEOS: $Si(OC_2H_5)_4$) for a source gas, and the other reaction chamber (a second reaction chamber) may be used to form a silicon nitride film, a silicon film, and a silicon film containing an impurity element imparting one conductivity type. Alternatively, an apparatus provided with only one reaction chamber may also be used.

Figure 12C:
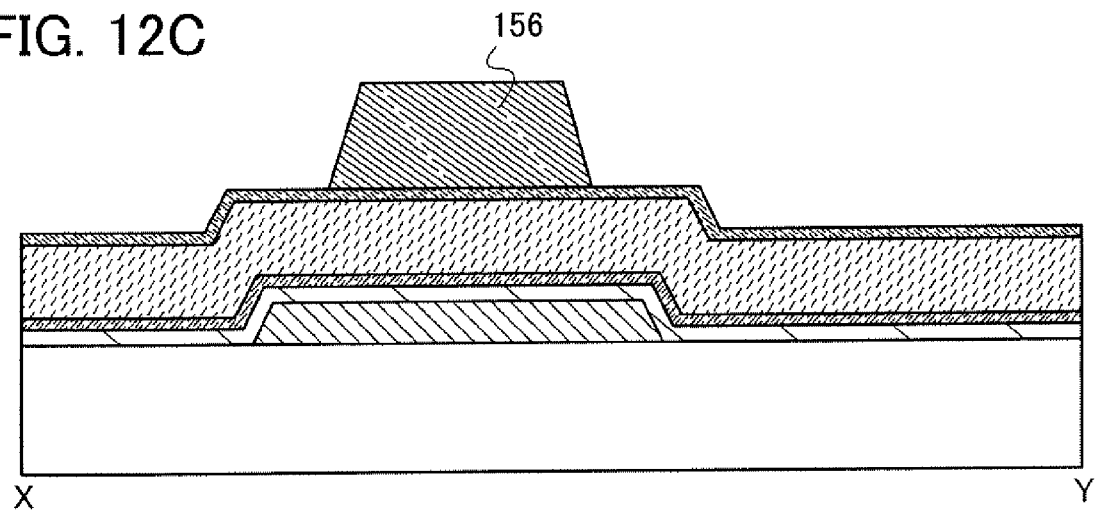

Next, a resist mask 156 is formed over the impurity semiconductor film 154 which is to be the impurity semiconductor layers 110 (FIG. 12C). The resist mask 156 can be fowled by a photolithography method. Alternatively, the resist mask 156 may be formed by an inkjet method or the like. Further alternatively, for the purpose of cost reduction, the resist mask 156 may be formed by a printing method or subjected to laser processing after being formed by a printing method.

Figure 14A:
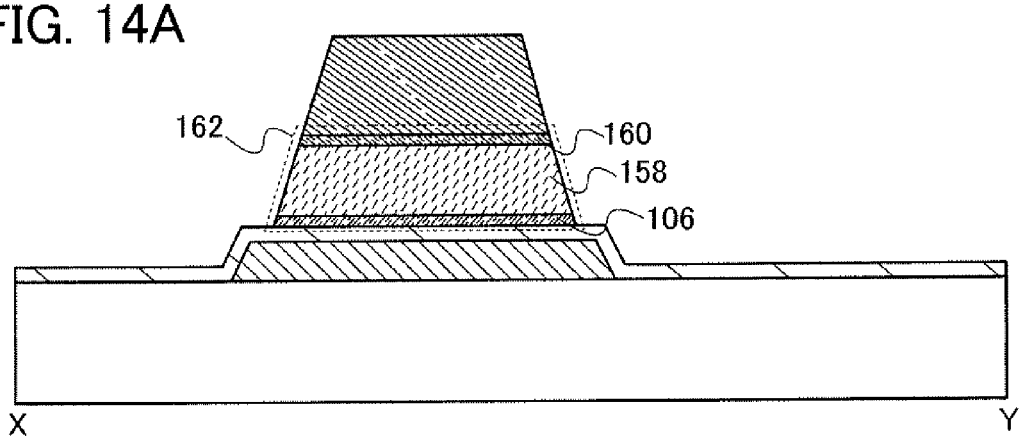
FIGS. 14A to 14C illustrate a method for manufacturing a thin film transistor.

Next, the first semiconductor film 150, the second semiconductor film 152, and the impurity semiconductor film 154 are etched using the resist mask 156. By this etching, these films can be separated corresponding to each element, and the first semiconductor layer 106, a second semiconductor layer 158, and an impurity semiconductor layer 160 are formed (FIG. 14A). After that, the resist mask 156 is removed.

This etching is preferably performed so that the side surface of a stack 162 including the first semiconductor layer 106, the second semiconductor layer 158, and the impurity semiconductor layer 160 can have a tapered shape. The taper angle is 30° to 90° inclusive, preferably 40° to 80° inclusive. When the side surface of the stack 162 has a tapered shape, coverage with a film to be formed thereover (e.g., a conductive film 164) in a later step can be improved, and disconnection of a wiring or the like can be prevented.

Figure 14B:
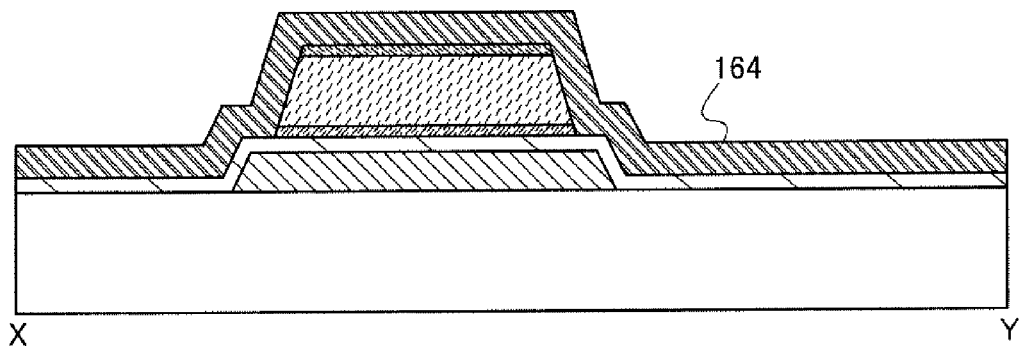

Then, the conductive film 164 is formed over the stack 162 (FIG. 14B). The conductive film 164 which is formed here becomes the source and drain electrode layers 112, and thus, at least a portion in contact with the first semiconductor layer 106 is formed using a metal material with a low work function. That is, when the conductive film 164 is a single layer, the conductive film 164 is formed using a metal material with a low work function. When the conductive film 164 is formed by stacking a plurality of layers, at least the lowermost layer of the conductive film 164 is formed using a metal material with a low work function.

The conductive film 164 may be formed by a sputtering method, a vacuum evaporation method, or the like. Alternatively, the conductive film 164 may be formed by discharging a conductive nanopaste of silver, gold, copper, or the like by a screen printing method, an inkjet method, or the like and baking it.

Figure 14C:
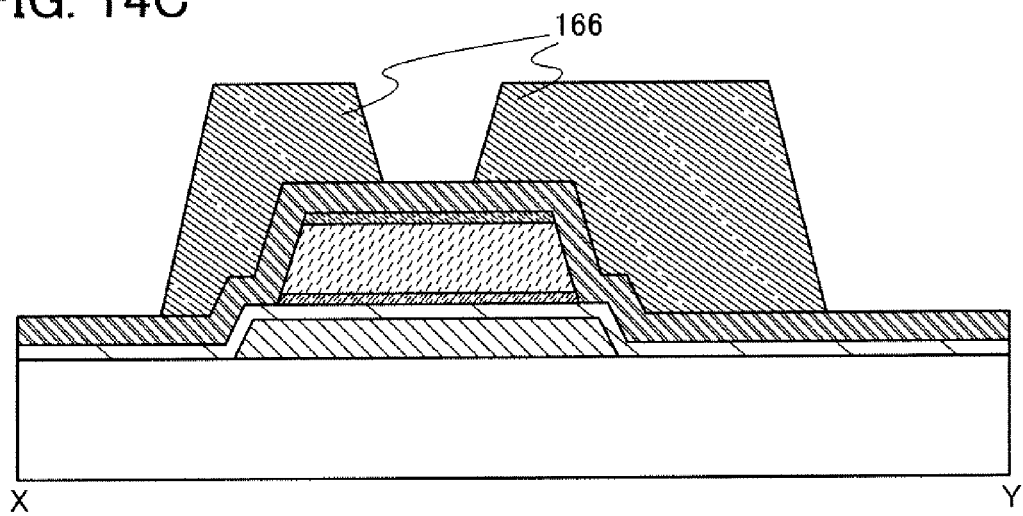

Next, a resist mask 166 is formed over the conductive film 164 (FIG. 14C). In a similar manner to the resist mask 156, the resist mask 166 can be formed by a photolithography method or an inkjet method. Alternatively, for the purpose of cost reduction, the resist mask 166 may be formed by a printing method or subjected to laser processing after being formed by a printing method. In addition, oxygen plasma ashing may be conducted to control the size of the resist mask.

Next, the conductive film 164 is etched to be patterned using the resist mask 166, thereby forming the source and drain electrode layers 112. In this embodiment, etching can be wet etching, for example. By using wet etching, portions of the conductive film 164 which are not covered with the resist mask 166 are etched isotropically. As a result, the conductive layer recedes so that it is on an inner side than the resist mask 166, and thus the source and drain electrode layer 112 are formed. The source and drain electrode layers 112 serve not only as a source electrode and a drain electrode but also as a signal line. Note that dry etching may also be used without limitation to the wet etching.

Next, the second semiconductor layer 158 and the impurity semiconductor layer 160 are etched with the resist mask 166 formed thereover, so that a back channel portion is formed. By this etching, a part of the second semiconductor layer 158 is etched off, so that the second semiconductor layer 108 and the impurity semiconductor layers 110 are formed.

At this time, as the etching process, dry etching, particularly, dry etching using a gas containing oxygen is preferably conducted. With the use of the gas containing oxygen, the impurity semiconductor layers 110 and the second semiconductor layer 108 can be formed by etching while the resist is reduced in its size, so that the side surfaces of the impurity semiconductor layers 110 and the second semiconductor layer 108 which is an amorphous semiconductor layer can be formed to have a tapered shape. As the etching gas, for example, an etching gas in which oxygen is mixed into tetrafluoromethane ($CF_4$) or an etching gas in which oxygen is mixed into chlorine is used. The tapered shape of the side surfaces of the impurity semiconductor layers 110 and the second semiconductor layer 108 which is an amorphous semiconductor layer can prevent concentration of an electric field and reduce off current.

The second semiconductor layer 108 has a depression portion which is formed when a part of the second semiconductor layer 108 is etched off. The second semiconductor layer 108 is preferably formed to a thickness such that at least a part of the second semiconductor layer 108 overlapping with the depression portion remains after etching. A portion of the second semiconductor layer 108 which overlaps with the impurity semiconductor layers 110 is not etched in forming the source and drain regions, and may have a thickness of about 80 nm to 500 nm inclusive, preferably 150 nm to 400 nm inclusive, more preferably 200 nm to 300 nm inclusive. By forming the second semiconductor layer 108 with a sufficient thickness as described above, mixture of an impurity element or the like into the first semiconductor layer 106 can be prevented. In this manner, the second semiconductor layer 108 also serves as a protective layer of the first semiconductor layer 106.

Then, the resist mask 166 is removed.

A constituent of a resist stripper used for removal of the resist mask 166, a residue in the back channel portion generated in the above steps, or the like often has an adverse effect on electric characteristics. Therefore, in order to remove such a constituent, a residue, or the like, one or more of etching, plasma treatment, and cleaning are further performed after removal of the resist mask 166, whereby a thin film transistor with high electric characteristics (e.g., small off current) can be manufactured.

Alternatively, after the source and drain electrode layers 112 are formed, the resist mask 166 may be removed, and etching may be performed using the source and drain electrode layers 112 as masks, so that the second semiconductor layer 108 and the impurity semiconductor layers 110 can be formed.

Figure 15A:
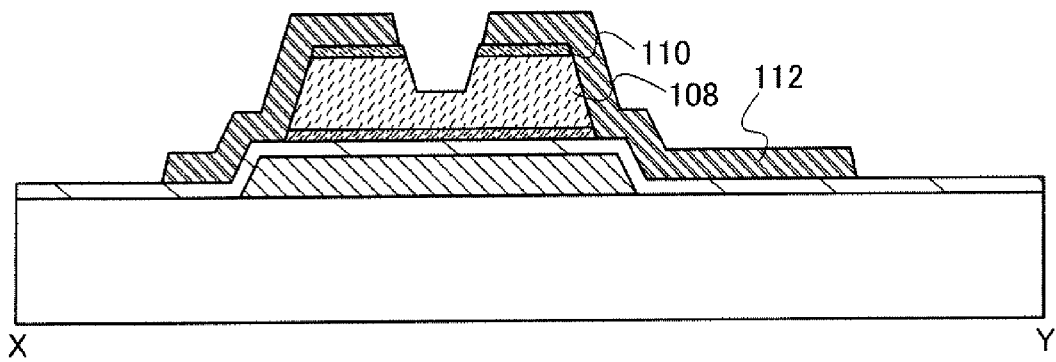
FIGS. 15A to 15C illustrate a method for manufacturing a thin film transistor.

Through the above process, the bottom gate thin film transistor illustrated in FIGS. 1A and 1B can be manufactured (FIG. 15A). The bottom gate thin film transistor illustrated in FIGS. 2A and 2B can also be manufactured through a process similar to the above.

Figure 15B:
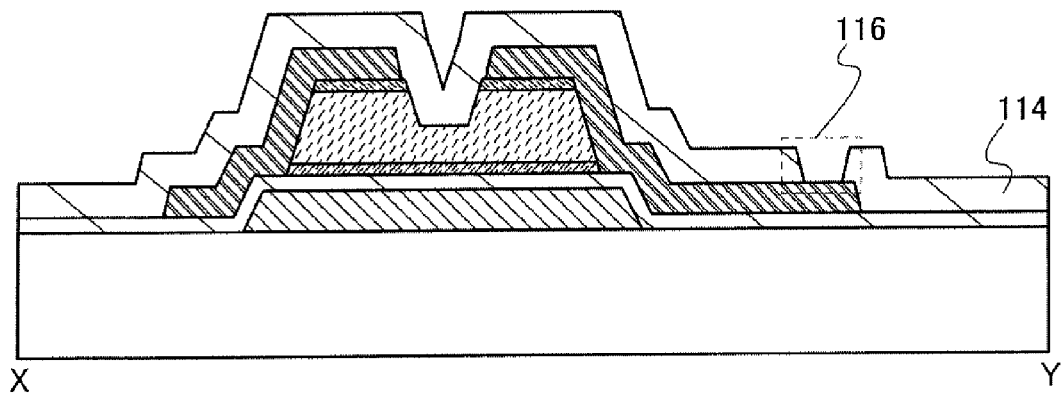

Next, a protective layer 114 is formed to cover the thin film transistor manufactured as described above (FIG. 15B). The protective layer 114 can be formed in a manner similar to the gate insulating layer 104. The protective layer 114 is preferably formed using silicon nitride. In particular, the protective layer 114 is preferably a dense silicon nitride layer such that entry of a contaminant impurity element such as an organic substance, a metal substance, or moisture contained in the air can be prevented.

Note that the thin film transistor illustrated in FIGS. 1A and 1B can be used as a pixel transistor, and thus, one of the source electrode and the drain electrode is connected to the pixel electrode. In the thin film transistor illustrated in FIGS. 1A and 1B, one of the source electrode and the drain electrode is connected to the pixel electrode layer 118 through the opening 116 provided in the protective layer 114.

The pixel electrode layer 118 can be formed using a conductive composition containing a conductive high molecule (also referred to as a conductive polymer) having a light-transmitting property by a sputtering method or the like. In this embodiment, ITO may be formed by a sputtering method.

Figure 15C:
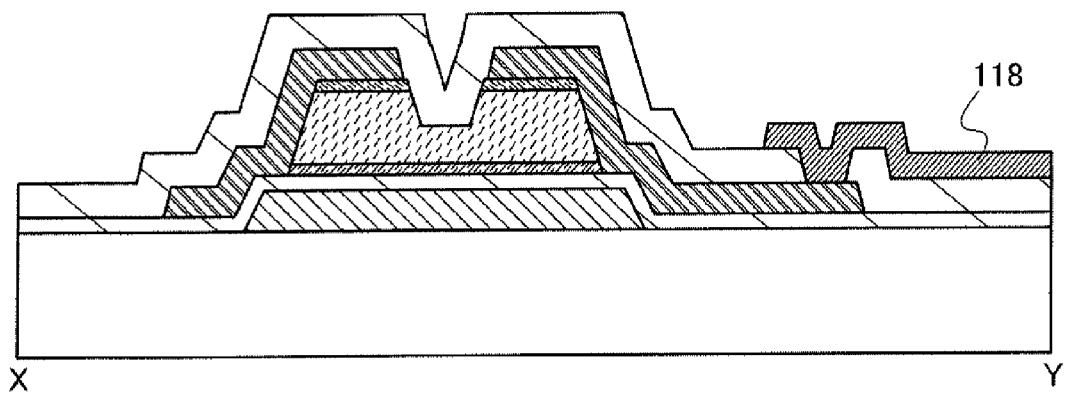

The pixel electrode layer 118 may be formed in a manner similar to the source and drain electrode layers 112 or the like, in other words, a conductive film is formed over the entire surface and etched using a resist mask or the like to be patterned (FIG. 15C).

Although not illustrated, an organic resin layer may be formed between the protective layer 114 and the pixel electrode layer 118 by a spin coating method or the like so that a surface where the pixel electrode layer 118 is formed can be flat.

Note that in the above description, the gate electrode and the scan line are formed in the same process, and the source and drain electrodes and the signal line are formed in the same process. However, the present invention is not limited to the description. The electrode and the wiring connected to the electrode may be formed in different processes.

In this embodiment, the semiconductor layer having a stacked layer structure is described but the present invention is not limited thereto. The semiconductor layer may be one crystalline semiconductor layer.

In the above manner, a thin film transistor with small light leakage current and small off current can be obtained. Further, a thin film transistor with small light leakage current and a high on/off ratio can be obtained.

Embodiment 2

In this embodiment, a display device or a light-emitting device which includes the thin film transistor described in Embodiment 1 according to one embodiment of the present invention will be described with reference to the drawings.

In the display device or the light-emitting device according to this embodiment, a signal line driver circuit and a scan line driver circuit may be formed over a different substrate (for example, a semiconductor substrate or an SOI substrate) and then connected to a pixel portion or may be formed over the same substrate as a pixel circuit.

Note that there are no particular limitations on the connection method of a substrate separately formed: a known method such as a COG method, a wire bonding method, or a TAB method can be used. Further, a connection position is not limited to a particular position as long as electrical connection is possible. Moreover, a controller, a CPU, a memory, and/or the like may be formed separately and connected to the pixel circuit.

Figure 16:
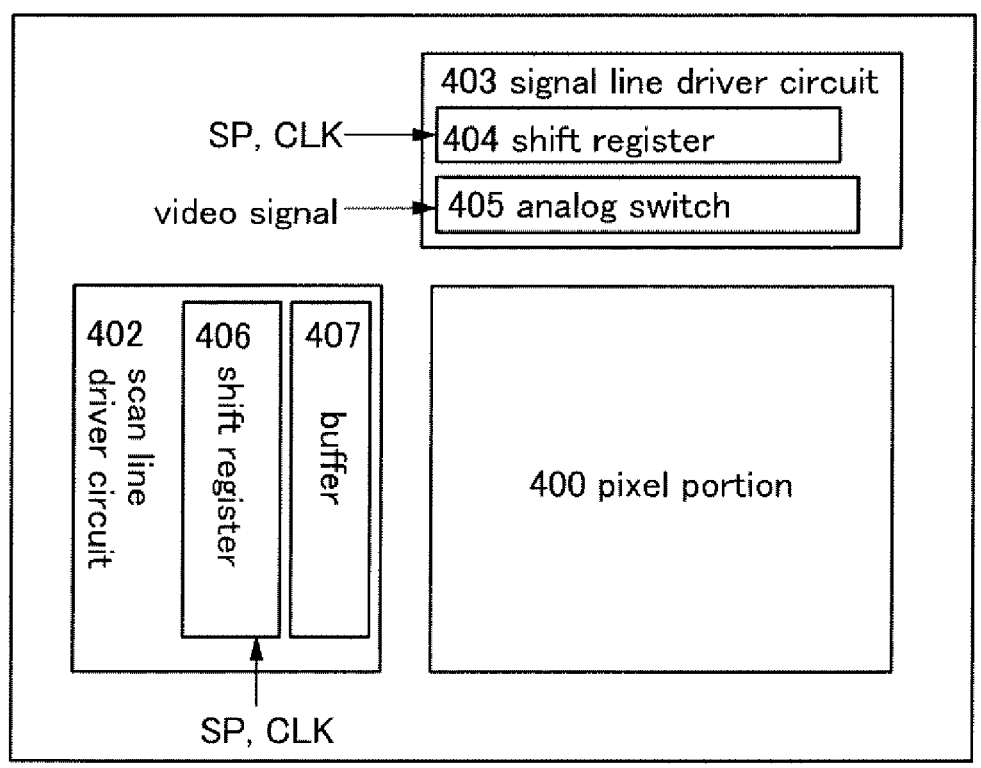
FIG. 16 is a block diagram illustrating a structure of a display device.

FIG. 16 is an example of a block diagram of a display device in this embodiment. The display device illustrated in FIG. 16 includes a pixel portion 400 including a plurality of pixels each provided with a display element, a scan line driver circuit 402 which selects each pixel included in the pixel portion 400, and a signal line driver circuit 403 which controls input of a video signal to a selected pixel.

Note that the display device in this embodiment is not limited to the mode illustrated in FIG. 16. That is, the signal line driver circuit is not limited to a mode including only a shift register and an analog switch. In addition to the shift register and the analog switch, another circuit such as a buffer, a level shifter, or a source follower may be included. Further, the shift register and the analog switch are not necessarily provided. For example, another circuit such as a decoder circuit by which a signal line can be selected may be used instead of the shift register, or a latch or the like may be used instead of the analog switch.

The signal line driver circuit 403 illustrated in FIG. 16 includes a shift register 404 and an analog switch 405. A clock signal (CLK) and a start pulse signal (SP) are input to the shift register 404. When the clock signal (CLK) and the start pulse signal (SP) are input, a timing signal is generated in the shift register 404 and input to the analog switch 405.

A video signal is supplied to the analog switch 405. The analog switch 405 samples the video signal in accordance with the timing signal input from the shift register 404 and supplies the sampled signal to a signal line of the subsequent stage.

The scan line driver circuit 402 illustrated in FIG. 16 includes a shift register 406 and a buffer 407. Further, a level shifter may be included. In the scan line driver circuit 402, when the clock signal (CLK) and the start pulse signal (SP) are input to the shift register 406, a selection signal is generated. The generated selection signal is buffered and amplified by the buffer 407, and the buffered and amplified signal is supplied to a corresponding scan line. Gates of all pixel transistors of one line are connected to one scan line. Further, because the pixel transistors of one line should be turned on at the same time in the operation, the buffer 407 which can supply large current is used.

In a full-color display device, when video signals corresponding to R (red), G (green), and B (blue) are sequentially sampled and supplied to corresponding signal lines, the number of terminals for connecting the shift register 404 and the analog switch 405 corresponds to approximately ⅓ of the number of terminals for connecting the analog switch 405 and the signal line of the pixel portion 400. Accordingly, compared to the case where the analog switch 405 and the pixel portion 400 are formed over different substrates, the number of terminals used for connecting a substrate which is separately formed can be suppressed when the analog switch 405 and the pixel portion 400 are formed over one substrate. Thus, occurrence of bad connection can be suppressed and yield can be improved.

Note that although the scan line driver circuit 402 in FIG. 16 includes the shift register 406 and the buffer 407, the present invention is not limited thereto. The scan line driver circuit 402 may be formed using only the shift register 406.

Note that the structures of the signal line driver circuit and the scan line driver circuit are not limited to the structures illustrated in FIG. 16, which is merely one mode of the display device.

Figure 17A:
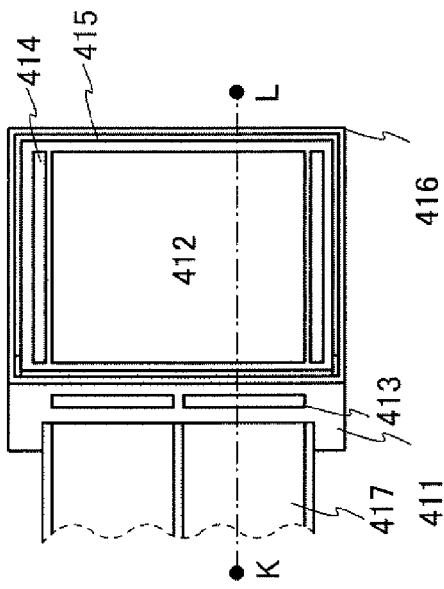
FIGS. 17A and 17B are a top view and a cross-sectional view, respectively, illustrating a liquid crystal display panel.
Figure 17B:
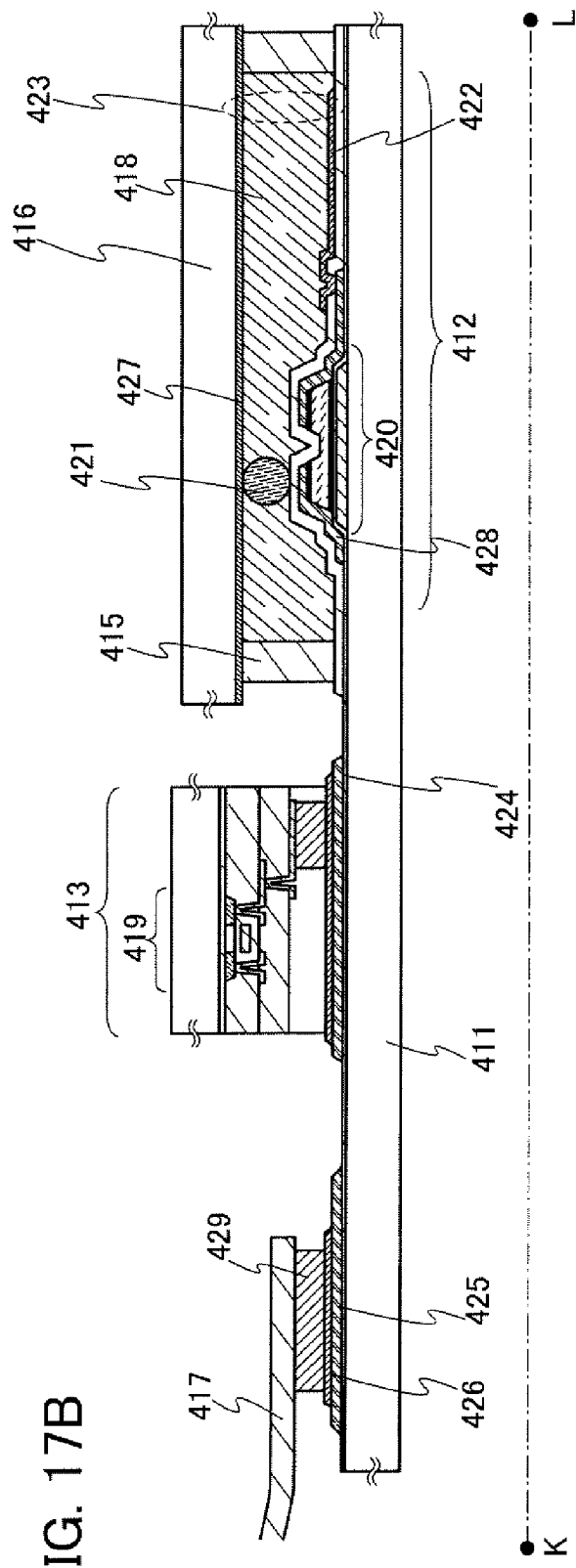
Figure 18A:
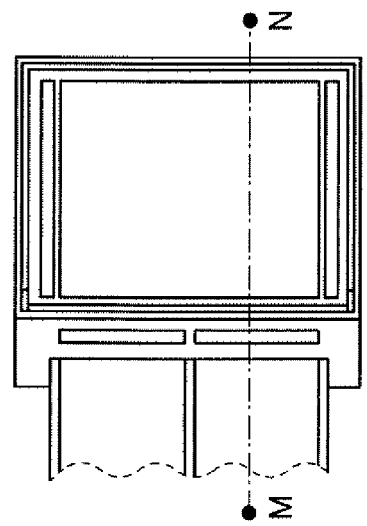
FIGS. 18A and 18B are a top view and a cross-sectional view, respectively, illustrating a light-emitting display panel.
Figure 18B:
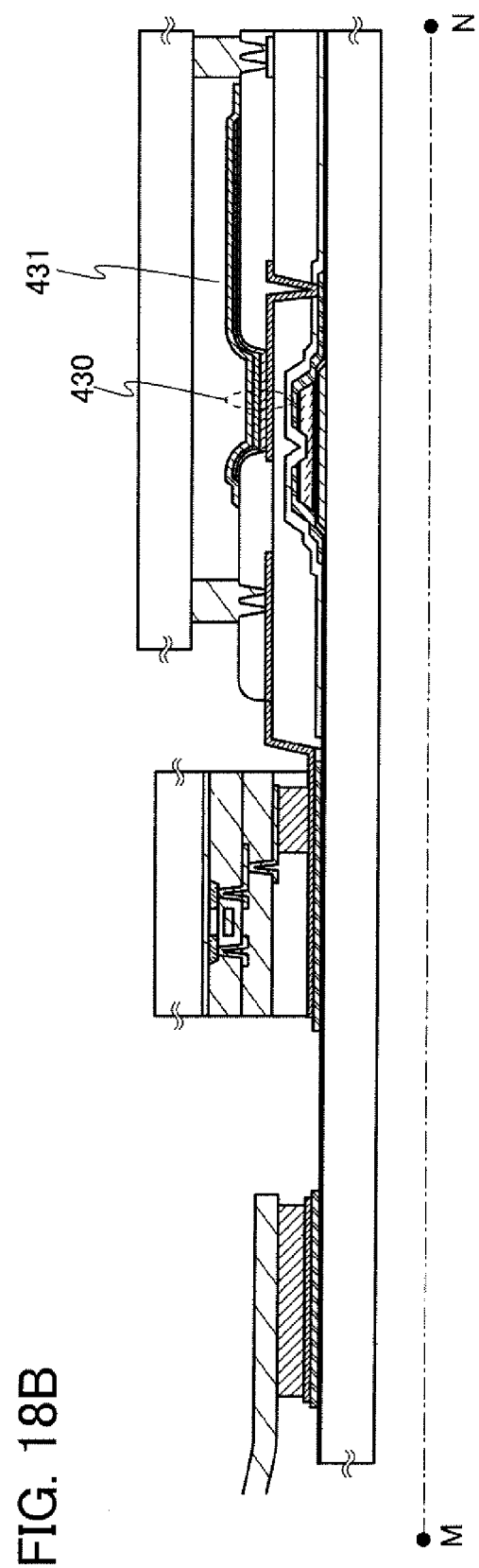

Next, appearance of a liquid crystal display device and a light-emitting device, each of which is one mode of the display device, will be described with reference to FIGS. 17A and 17B and FIGS. 18A and 18B. FIG. 17A is a top view of a display device in which a thin film transistor 420 including a crystalline semiconductor layer and a liquid crystal element 423 that are formed over a first substrate 411 are sealed with a sealant 415 between the first substrate 411 and a second substrate 416. FIG. 17B is a cross-sectional view taken along line K-L in FIG. 17A. FIGS. 18A and 18B illustrate a light-emitting device. In FIGS. 18A and 18B, only portions which are different from FIGS. 17A and 17B are denoted by reference numerals.

In FIGS. 17A and 17B and FIGS. 18A and 18B, the sealant 415 is provided so as to surround a pixel portion 412 and a scan line driver circuit 414 that are provided over the first substrate 411. The second substrate 416 is provided over the pixel portion 412 and the scan line driver circuit 414. Thus, the pixel portion 412 and the scan line driver circuit 414, together with a liquid crystal layer 418 (or a filler 431 in FIGS. 18A and 18B), are sealed with the first substrate 411, the sealant 415, and the second substrate 416. Further, a signal line driver circuit 413 is mounted on a region over the first substrate 411, which is different from the region surrounded by the sealant 415. Note that the signal line driver circuit 413 is formed with thin film transistors having a crystalline semiconductor layer formed over a separately prepared substrate but is not limited thereto. Note that although an example in which the signal line driver circuit 413 including a thin film transistor using a crystalline semiconductor layer is attached to the first substrate 411 is described in this embodiment, a signal line driver circuit is preferably formed with a thin film transistor using a single crystal semiconductor and attached to the first substrate 411. FIG. 17B illustrates a thin film transistor 419 formed using a crystalline semiconductor layer, which is included in the signal line driver circuit 413.

The pixel portion 412 provided over the first substrate 411 includes a plurality of thin film transistors, and in FIG. 17B, a thin film transistor 420 included in the pixel portion 412 is exemplified. In addition, the signal line driver circuit 413 also includes a plurality of thin film transistors, and in FIG. 17B, a thin film transistor 419 included in the signal line driver circuit 413 is exemplified. In the light-emitting device in this embodiment, the thin film transistor 420 may be a driving transistor, a current control transistor, or an erasing transistor. The thin film transistor 420 corresponds to the thin film transistor including a crystalline semiconductor layer described in Embodiment 1.

In addition, a pixel electrode 422 of the liquid crystal element 423 is electrically connected to the thin film transistor 420 through a wiring 428. A counter electrode 427 of the liquid crystal element 423 is formed on the second substrate 416. The liquid crystal element 423 corresponds to a portion where the pixel electrode 422, the counter electrode 427, and the liquid crystal layer 418 overlap with each other.

In FIGS. 18A and 18B, a pixel electrode included in a light-emitting element 430 is electrically connected to a source or drain electrode of the thin film transistor 420 through a wiring. Further in this embodiment, a light-transmitting conductive layer and a common electrode of the light-emitting element 430 are electrically connected to each other. The structure of the light-emitting element 430 is not limited to the structure described in this embodiment. The structure of the light-emitting element 430 can be determined in accordance with a direction of light taken from the light-emitting element 430, polarity of the thin film transistor 420, or the like.

The first substrate 411 and the second substrate 416 can be formed using glass, metal (a typical example is stainless steel), ceramics, plastics, or the like. As plastic, a fiberglass-reinforced plastic (FRP) plate, a polyvinyl fluoride (PVF) film, a polyester film, an acrylic resin film, or the like can be used. Further, a sheet in which aluminum foil is sandwiched by PVF films or polyester films may be used.

A spacer 421 is a bead spacer, and is provided to control a distance (a cell gap) between the pixel electrode 422 and the counter electrode 427. Further, a spacer (a post spacer) which is obtained by selectively etching an insulating layer may also be used.

A variety of signals (potentials) supplied to the pixel portion 412 and the scan line driver circuit 414, and the signal line driver circuit 413 which is formed separately are supplied from an FPC (flexible printed circuit) 417 through a lead wiring 424 and a lead wiring 425.

In FIGS. 17A and 17B, a connection terminal 426 is formed using the same conductive layer as the pixel electrode 422 included in the liquid crystal element 423. Further, the lead wiring 424 and the lead wiring 425 are formed using the same conductive layer as the wiring 428. However, the present invention is not limited thereto.

The connection terminal 426 is electrically connected to a terminal included in the FPC 417 through an anisotropic conductive layer 429.

Although not illustrated, the liquid crystal display device described in this embodiment includes alignment films and polarizing plates, and may also include a color filter, a light-blocking layer or the like.

In FIGS. 18A and 18B, a connection terminal 426 is formed using the same conductive layer as the pixel electrode included in the light-emitting element 430. Further, a lead wiring 425 is formed using the same conductive layer as the wiring 428. However, the present invention is not limited thereto.

As the second substrate located in the direction in which light is extracted from the light-emitting element 430, a light-transmitting substrate is used. In that case, a substrate formed using a light-transmitting material such as a glass plate, a plastic plate, a polyester film, or an acrylic film is used. When light is extracted from the light-emitting element 430 in a direction of the first substrate, a light-transmitting substrate is used as the first substrate.

As the filler 431, an ultraviolet curable resin, a thermosetting resin, or the like as well as an inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used. In this embodiment, for example, nitrogen may be used.

An optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection layer.

As described above, a display device can be manufactured by using the thin film transistor described in Embodiment 1.

Embodiment 3

In this embodiment, an electronic device on which the display device described in Embodiment 2 is mounted will be described with reference to the drawings. Examples of such an electronic device include a television set (also referred to as a television or a television receiver), a monitor of a computer, electronic paper, a camera such as a digital camera or a digital video camera, a digital photo frame, a mobile phone set (also referred to as a mobile phone or a mobile phone device), a portable game machine, a portable information terminal, an audio reproducing device, a large-sized game machine such as a pachinko machine, and the like.

Figure 19A:
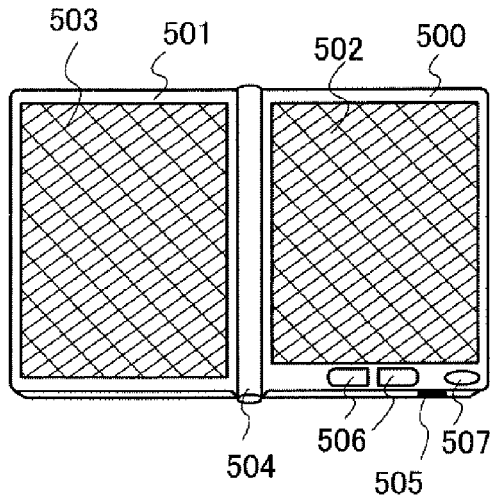
FIGS. 19A to 19D each illustrate an electronic device using a display device.

As an example of the electronic device, electronic paper is given. Electronic paper can be used for electronic devices of a variety of fields as long as they can display data. For example, electronic paper can be used for an electronic book device (e-book), posters, advertisement in vehicles such as trains, display of data on a variety of cards such as credit cards, and so on. FIG. 19A illustrates an example of the electronic device.

FIG. 19A illustrates an example of the electronic book device. The electronic book device illustrated in FIG. 19A includes housings 500 and 501. The housings 500 and 501 are connected with a hinge 504 so that the electronic book device can be opened and closed. With such a structure, the electronic book device can be handled like a paper book.

A display portion 502 and a display portion 503 are incorporated in the housing 500 and the housing 501, respectively. The display portions 502 and 503 may display one image or different images. In the structure where the display portions display different images from each other, for example, the right display portion (the display portion 502 in FIG. 19A) can display text and the left display portion (the display portion 503 in FIG. 19A) can display images. The display device described in Embodiment 2 can be applied to the display portions 502 and 503.

In addition, FIG. 19A illustrates an example in which the housing 500 is provided with an operation portion and the like. For example, the housing 500 is provided with a power input terminal 505, an operation key 506, a speaker 507, and the like. The page can be turned with the operation key 506, for example. Note that a keyboard, a pointing device, or the like may also be provided on the surface of the housing, on which the display portion is provided. Furthermore, an external connection terminal (an earphone terminal, a USB terminal, a terminal that can be connected to various cables such as a USB cable, or the like), a recording medium insertion portion, and the like may be provided on the back surface or the side surface of the housing. Further, the electronic book device illustrated in FIG. 19A may have a function of an electronic dictionary.

Further, the electronic book device illustrated in FIG. 19A may transmit and receive data wirelessly. By wireless communication, desired book data or the like can be purchased and downloaded from an electronic book server.

Figure 19B:
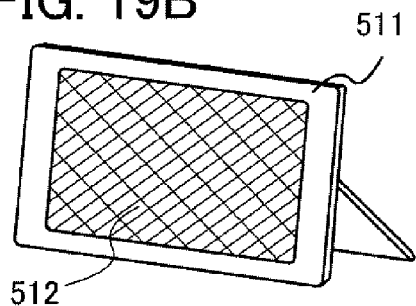

FIG. 19B illustrates an example of a digital photo frame. For example, in the digital photo frame illustrated in FIG. 19B, a display portion 512 is incorporated in a housing 511. The display portion 512 can display various images. For example, the display portion 512 can display data of an image shot by a digital camera or the like to function as a normal photo frame. The display device described in Embodiment 2 can be applied to the display portion 512.

Note that the digital photo frame illustrated in FIG. 19B may be provided with an operation portion, an external connection terminal, a recording medium insertion portion, and the like. Although they may be provided on the same surface as the display portion, it is preferable to provide them on the side surface or the back surface for the design of the digital photo frame. For example, a memory storing data of an image shot by a digital camera is inserted in the recording medium insertion portion of the digital photo frame, whereby the image data can be downloaded and displayed on the display portion 512.

The digital photo frame illustrated in FIG. 19B may be configured to transmit and receive data wirelessly. By wireless communication, desired image data can be downloaded to be displayed.

Figure 19C:
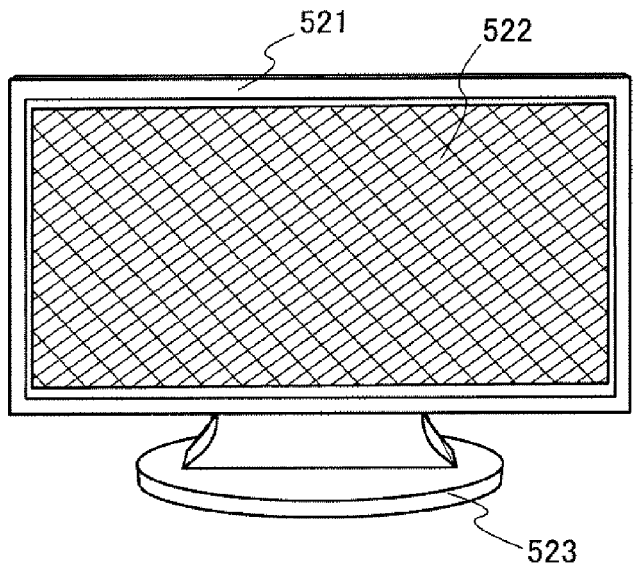

FIG. 19C illustrates an example of a television set. In the television set illustrated in FIG. 19C, a display portion 522 is incorporated in a housing 521. Images can be displayed on the display portion 522. Here, the housing 521 is supported by a stand 523. The display device described in Embodiment 2 can be applied to the display portion 522.

The television set illustrated in FIG. 19C can be operated by an operation switch of the housing 521 or a remote controller. Channels and volume can be controlled by an operation key of the remote controller so that an image displayed on the display portion 522 can be controlled. Further, the remote controller may be provided with a display portion for displaying data output from the remote controller. The display device described in Embodiment 2 can be applied to the display portion of the remote controller.

Note that the television set illustrated in FIG. 19C is provided with a receiver, a modem, and the like. With the receiver, a general television broadcast can be received. Further, when the television set is connected to a communication network by wired or wireless connection via the modem, one-way (from a transmitter to a receiver) or two-way (between a transmitter and a receiver, between receivers, or the like) data communication can be performed.

Figure 19D:
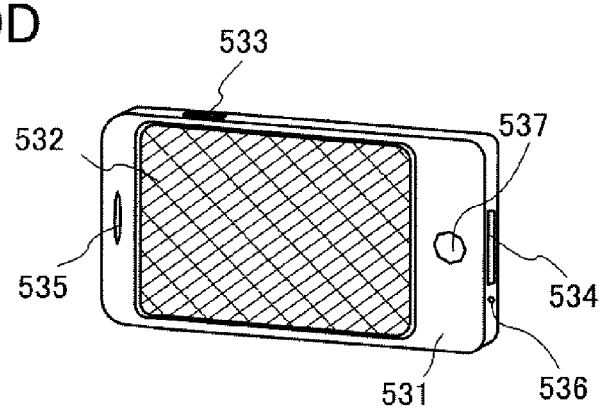

FIG. 19D illustrates an example of a mobile phone set. The mobile phone set illustrated in FIG. 19D is provided with a display portion 532 incorporated in a housing 531, operation buttons 533 and 537, an external connection port 534, a speaker 535, a microphone 536, and the like. The display device described in Embodiment 2 can be applied to the display portion 532.

The display portion 532 of the mobile phone set illustrated in FIG. 19D may be a touch panel. When the display portion 532 is touched with a finger or the like, contents displayed on the display portion 532 can be controlled. In this case, making calls, composing mails, and the like can be performed by touching the display portion 532 with a finger or the like.

There are mainly three screen modes for the display portion 532. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 532 so that text displayed on the screen may be input. In that case, it is preferable to display a keyboard or number buttons on a large area of the screen of the display portion 532.

When a detection device including a sensor for detecting inclination, such as a gyroscope or an acceleration sensor, is provided inside the mobile phone set illustrated in FIG. 19D, display data for the display portion 532 can be automatically switched by determining the orientation of the mobile phone set (whether the mobile phone set is placed horizontally or vertically for a landscape mode or a portrait mode).

The screen modes may be switched by touching the display portion 532 or operating the operation button 537 of the housing 531. Alternatively, the screen modes may be switched depending on the kind of the image displayed on the display portion 532. For example, when a signal of an image displayed on the display portion is the one of moving image data, the screen mode is changed to the display mode. When the signal is the one of text data, the screen mode is changed to the input mode.

Moreover, in the input mode, when input by touching the display portion 532 is not performed for a specified period of time while a signal detected by an optical sensor in the display portion 532 is detected, the screen mode may be controlled so as to be switched from the input mode to the display mode.

The display portion 532 can also function as an image sensor. For example, an image of a palm print, a fingerprint, or the like is taken by the image sensor by touching the display portion 532 with a palm or a finger, whereby personal authentication can be performed. Furthermore, by providing a backlight or a sensing light source emitting a near-infrared light for the display portion, an image of a finger vein, a palm vein, or the like can also be taken.

Example 1

In this example, measurement results of electric characteristics of a thin film transistor manufactured according to Embodiment 1 and the like will be described.

Figure 20A:
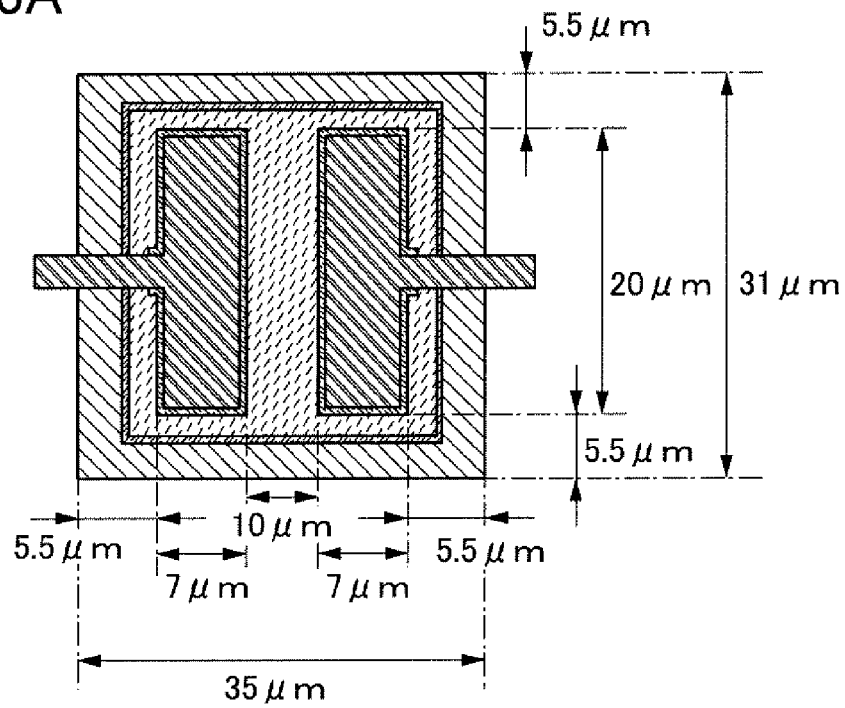
FIGS. 20A and 20B each illustrate an example of a structure of a thin film transistor.
Figure 20B:
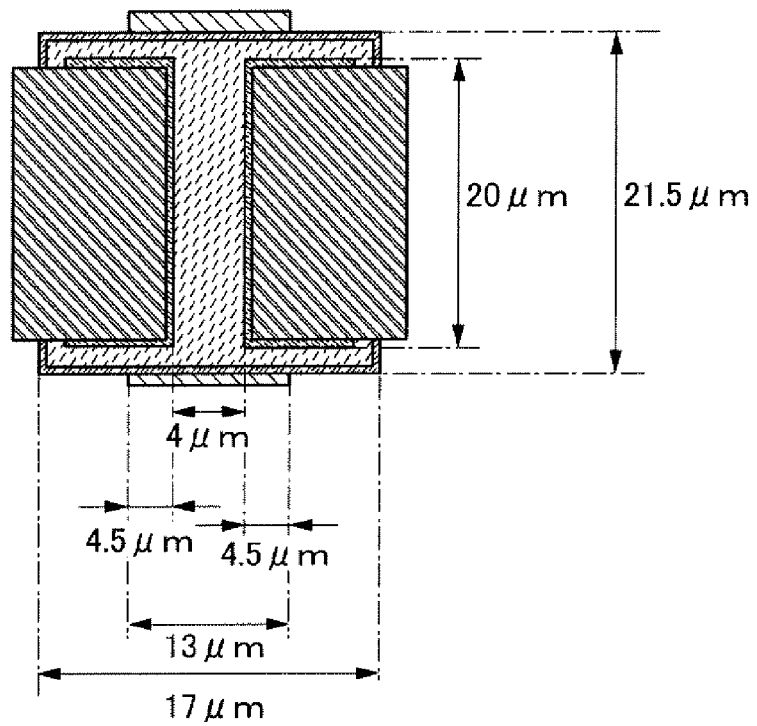

FIGS. 10A and 10B show curves representing current-voltage characteristics of drain current with respect to gate voltage (hereinafter I-V curve) of the thin film transistors illustrated in FIGS. 1A and 1B and FIGS. 2A and 2B. As described in the above embodiments, the source and drain electrode layers are formed using molybdenum which is a material with a high work function. FIG. 10A shows an I-V curve of the thin film transistor illustrated in FIGS. 2A and 2B, and FIG. 10B shows an I-V curve of the thin film transistor illustrated in FIGS. 1A and 1B. The dimensions of the thin film transistors are as described in FIGS. 20A and 20B.

As described in the above embodiments, comparison between FIGS. 10A and 10B shows that, in the case where the source and drain electrode layers are formed using molybdenum, off current of the thin film transistor illustrated in FIGS. 1A and 1B is much larger than that of the thin film transistor illustrated in FIGS. 2A and 2B, which makes it difficult for the thin film transistor to normally function as a switching element. When FIGS. 11A and 11B are compared, there is no large difference between off current of the thin film transistor illustrated in FIGS. 1A and 1B and that of the thin film transistor illustrated in FIGS. 2A and 2B. Therefore, it is particularly effective to form the source and drain electrode layers of the thin film transistor illustrated in FIGS. 1A and 1B using a material with a low work function.

FIGS. 3A and 3B show I-V curves of the thin film transistors illustrated in FIGS. 4A and 4B. The thin film transistor of FIG. 4A does not include the first semiconductor layer 106, but other components thereof are similar to those of the thin film transistor illustrated in FIGS. 1A and 1B. Note that the second semiconductor layer 108 is formed using an amorphous semiconductor. The thin film transistor of FIG. 4B does not include the first semiconductor layer 206, but other components thereof are similar to those of the thin film transistor illustrated in FIGS. 2A and 2B. Note that the second semiconductor layer 208 is formed using an amorphous semiconductor. That is, the thin film transistors illustrated FIGS. 4A and 4B are each a thin film transistor in which a channel formation region is formed using an amorphous semiconductor layer. The source and drain electrode layers are formed using molybdenum as in FIGS. 10A and 10B. The dimensions of the thin film transistors are as described in FIGS. 20A and 20B.

According to FIGS. 3A and 3B, in the thin film transistor in which the channel formation region is formed using an amorphous semiconductor layer, there is no large difference in I-V curves between the structure in which the gate electrode layer overlaps with the entire surface of the semiconductor layer (the structure illustrated in FIG. 4A) and the structure in which the gate electrode layer overlaps with only a part of the semiconductor layer (the structure illustrated in FIG. 4B). Therefore, in the case where the first semiconductor layer is formed using a crystalline semiconductor layer, it is particularly effective to form the source and drain electrode layers using a material with a low work function.

This application is based on Japanese Patent Application serial no. 2008-316196 filed with Japan Patent Office on Dec. 11, 2008 and Japanese Patent Application serial no. 2009-128675 filed with Japan Patent Office on May 28, 2009, the entire contents of which are hereby incorporated by reference.

REFERENCE NUMERALS

100: substrate, 102: gate electrode layer, 104: gate insulating layer, 106: first semiconductor layer, 108: second semiconductor layer, 110: impurity semiconductor layer, 112: source and drain electrode layer, 114: protective layer, 116: opening, 118: pixel electrode layer, 130: portion, 131: portion, 132: portion, 150: first semiconductor film, 152: second semiconductor film, 154: impurity semiconductor film, 156: resist mask, 158: second semiconductor layer, 160: impurity semiconductor layer, 162: stack, 164: conductive film, 166: resist mask, 200: substrate, 202: gate electrode layer, 204: gate insulating layer, 206: first semiconductor layer, 208: second semiconductor layer, 210: impurity semiconductor layer, 212: source and drain electrode layer, 214: protective layer, 216: opening, 218: pixel electrode layer, 230: portion, 231: portion, 250a: reaction chamber, 250b: reaction chamber, 250c: reaction chamber, 250d: reaction chamber, 252: high-frequency power source, 254: matching box, 258: gas supply unit, 258a: gas supply unit, 258b: gas supply unit, 258c: gas supply unit, 258d: gas supply unit, 258e: gas supply unit, 258f: gas supply unit, 260: butterfly valve, 262: conductance valve, 264: turbo-molecular pump, 266: dry pump, 268:

cryopump, 270: load/unload chamber, 272: common chamber, 274: gate valve, 276: transfer unit, 400: pixel portion, 402: scan line driver circuit, 403: signal line driver circuit, 404: shift register, 405: analog switch, 406: shift register, 407: buffer, 411: substrate, 412: pixel portion, 413: signal line driver circuit, 414: scan line driver circuit, 415: sealant, 416: substrate, 417: FPC, 418: liquid crystal layer, 419: thin film transistor, 420: thin film transistor, 421: spacer, 422: pixel electrode, 423: liquid crystal element, 424: wiring, 425: wiring, 426: connection terminal, 427: counter electrode, 428: wiring, 429: anisotropic conductive layer, 430: light-emitting element, 431: filler, 500: housing, 501: housing, 502: display portion, 503: display portion, 504: hinge, 505: power input terminal, 506: operation key, 507: speaker, 511: housing, 512: display portion, 521: housing, 522: display portion, 523: stand, 531: housing, 532: display portion, 533: operation button, 534: external connection port, 535: speaker, 536: microphone, 537: operation button

The invention claimed is:

1. A thin film transistor comprising:
a gate electrode layer;
a first semiconductor layer;
a second semiconductor layer provided on and in contact with the first semiconductor layer, wherein carrier mobility of the second semiconductor layer is lower than carrier mobility of the first semiconductor layer;
a gate insulating layer provided between and in contact with the gate electrode layer and the first semiconductor layer;
a pair of impurity semiconductor layers provided in contact with the second semiconductor layer;
a source electrode layer provided partially in contact with one of the impurity semiconductor layers, the first semiconductor layer, and the second semiconductor layer; and
a drain electrode layer provided partially in contact with the other of the impurity semiconductor layers, the first semiconductor layer, and the second semiconductor layer;
wherein an entire surface of the first semiconductor layer on the gate electrode layer overlaps with the gate electrode layer;
wherein a material used for at least a part of the source electrode layer and the drain electrode layer comprises at least one of yttrium, zirconium, titanium containing a rare earth element, titanium containing one or both of yttrium and zirconium, and
wherein a potential barrier at a portion where the first semiconductor layer is in contact with the source electrode layer or the drain electrode layer is greater than or equal to 0.5 eV.

2. The thin film transistor according to claim 1, wherein a width of a forbidden band of the second semiconductor layer is larger than a width of a forbidden band of the first semiconductor layer with which the source electrode layer and the drain electrode layer are in contact.

3. The thin film transistor according to claim 1, wherein the first semiconductor layer includes a crystalline semiconductor and the second semiconductor layer includes an amorphous semiconductor.

4. The thin film transistor according to claim 3, wherein the first semiconductor layer is formed using a microcrystalline semiconductor and the microcrystalline semiconductor comprises crystal grains having a grain size of greater than or equal to 2 nm and less than or equal to 200 nm.

5. The thin film transistor according to claim 4, wherein the second semiconductor layer comprises the amorphous semiconductor and a minute semiconductor crystal grain.

6. The thin film transistor according to claim 5, wherein the amorphous semiconductor comprises an NH group.

7. The thin film transistor according to claim 1, wherein a distance from an interface between the gate insulating layer and the first semiconductor layer to the top of a convex portion of the second semiconductor layer is set at greater than or equal to 3 nm and less than or equal to 80 nm.

8. The thin film transistor according to claim 1, wherein the impurity semiconductor layers are formed using a crystalline semiconductor.

9. A thin film transistor comprising:
a gate electrode layer;
a first semiconductor layer;
a second semiconductor layer provided on and in contact with the first semiconductor layer, wherein carrier mobility of the second semiconductor layer is lower than carrier mobility of the first semiconductor layer;
a gate insulating layer provided between and in contact with the gate electrode layer and the first semiconductor layer;
a pair of impurity semiconductor layers provided in contact with the second semiconductor layer;
a source electrode layer provided partially in contact with one of the impurity semiconductor layers, the first semiconductor layer, and the second semiconductor layer; and
a drain electrode layer provided partially in contact with the other of the impurity semiconductor layers, the first semiconductor layer, and the second semiconductor layer;
wherein an entire surface of the first semiconductor layer on the gate electrode layer overlaps with the gate electrode layer;
wherein a material used for at least a part of the source electrode layer and the drain electrode layer comprises at least one of yttrium, zirconium, titanium containing a rare earth element, titanium containing one or both of yttrium and zirconium, and
wherein a work function of a material for forming the source electrode layer and the drain electrode layer is $\phi$, a difference between a vacuum level and a bottom of a mobility edge of the first semiconductor layer is $\chi_s$, a width of a forbidden band of the first semiconductor layer is $E_g$, and $E_g+\chi_s-\phi$ is greater than or equal to 0.5 eV.

10. The thin film transistor according to claim 9, wherein a width of a forbidden band of the second semiconductor layer is larger than a width of a forbidden band of the first semiconductor layer with which the source electrode layer and the drain electrode layer are in contact.

11. The thin film transistor according to claim 9, wherein the first semiconductor layer includes a crystalline semiconductor and the second semiconductor layer includes an amorphous semiconductor.

12. The thin film transistor according to claim 11, wherein the first semiconductor layer is formed using a microcrystalline semiconductor and the microcrystalline semiconductor comprises crystal grains having a grain size of greater than or equal to 2 nm and less than or equal to 200 nm.

13. The thin film transistor according to claim 12, wherein the second semiconductor layer comprises the amorphous semiconductor and a minute semiconductor crystal grain.

14. The thin film transistor according to claim 13, wherein the amorphous semiconductor comprises an NH group.

15. The thin film transistor according to claim 9, wherein a distance from an interface between the gate insulating layer and the first semiconductor layer to the top of a convex portion of the second semiconductor layer is set at greater than or equal to 3 nm and less than or equal to 80 nm.

16. The thin film transistor according to claim 9, wherein the impurity semiconductor layers are formed using a crystalline semiconductor.

* * * * *